United States Patent
Weber

(10) Patent No.: US 10,798,851 B1
(45) Date of Patent: Oct. 6, 2020

(54) SYSTEMS AND METHODS FOR IMPLEMENTING INTELLIGENT COOLING INTERFACE ARCHIECTURES FOR COOLING SYSTEMS

(71) Applicant: L3 Technologies, Inc., New York, NY (US)

(72) Inventor: Richard M. Weber, Prosper, TX (US)

(73) Assignee: L3 Technologies, Inc., New York, NY (US)

( * ) Notice: Subject to any disclaimer, the term of this patent is extended or adjusted under 35 U.S.C. 154(b) by 0 days.

(21) Appl. No.: 16/422,120

(22) Filed: May 24, 2019

(51) Int. Cl.
| | |
|---|---|
| H05K 7/20 | (2006.01) |
| F28D 15/06 | (2006.01) |
| F28F 23/02 | (2006.01) |
| F25B 39/02 | (2006.01) |
| H01L 23/473 | (2006.01) |

(52) U.S. Cl.
CPC ....... H05K 7/20481 (2013.01); F25B 39/028 (2013.01); F28D 15/06 (2013.01); F28F 23/02 (2013.01); H05K 7/20318 (2013.01); H05K 7/20327 (2013.01); H05K 7/20345 (2013.01); H05K 7/20381 (2013.01); H05K 7/20763 (2013.01); H01L 23/4735 (2013.01)

(58) Field of Classification Search
None
See application file for complete search history.

(56) References Cited

U.S. PATENT DOCUMENTS

| | | | |
|---|---|---|---|
| 4,068,495 A | 1/1978 | Alger et al. | |
| 5,023,695 A | 6/1991 | Umezawa et al. | |
| 5,220,804 A | 6/1993 | Tilton et al. | |
| 5,270,572 A | 12/1993 | Nakajima et al. | |
| 5,349,831 A | 9/1994 | Daikoku et al. | |
| 5,522,452 A | 6/1996 | Mizuno et al. | |
| 6,108,201 A | 8/2000 | Tilton et al. | |
| 6,123,145 A | 9/2000 | Glezer et al. | |
| 6,415,619 B1 * | 7/2002 | Bash | F25B 5/02 |
| | | | 257/E23.098 |

(Continued)

OTHER PUBLICATIONS

3M, "3M Novec 7500 Engineered Fluid", Product Information, 2008, 8 pgs.

(Continued)

Primary Examiner — Robert J Hoffberg
(74) Attorney, Agent, or Firm — Egan Peterman Enders Huston

(57) ABSTRACT

Systems and methods are provided to implement intelligent cooling interface architectures for cooling systems that employ a heat transfer interface between multiple separate coolant circulation loops. A heat transfer interface may be advantageously managed based on monitored real time operational parameters (e.g., operating conditions such as pressures, mass flow rates, temperatures, etc.) within one or more of the separate coolant loops. Diagnostics and prognostics may be performed to verify proper cooling system operation and to detect out-of-specification operational parameters based on expected or acceptable levels for these measurements in view of the heat load to be removed. In this way, the cooling system performance may be monitored to ensure proper operation and to anticipate and alert a user when cooling system operation is trending toward a failure condition.

34 Claims, 6 Drawing Sheets

(56) References Cited

U.S. PATENT DOCUMENTS

| | | | |
|---|---|---|---|
| 6,519,151 B2 | 2/2003 | Chu et al. | |
| 6,672,381 B2 * | 1/2004 | Beitelmal | F25B 5/04 |
| | | | 165/206 |
| 7,104,078 B2 | 9/2006 | Tilton | |
| 7,657,347 B2 * | 2/2010 | Campbell | G01F 1/6965 |
| | | | 137/340 |
| 7,806,166 B1 | 10/2010 | Tilton et al. | |
| 9,020,656 B2 * | 4/2015 | Shelnutt | G06F 1/206 |
| | | | 700/299 |
| 9,213,343 B2 * | 12/2015 | Campbell | H05K 7/2079 |
| 9,218,008 B2 * | 12/2015 | Campbell | H05K 7/2079 |
| 9,308,812 B2 * | 4/2016 | Buford | B60K 11/02 |
| 9,857,068 B2 * | 1/2018 | Nguyen | F21V 29/59 |
| 10,244,665 B2 * | 3/2019 | Campbell | H05K 7/2079 |
| 2007/0119572 A1 | 5/2007 | Weber et al. | |
| 2008/0069584 A1 | 3/2008 | Sanada et al. | |
| 2009/0283248 A1 | 11/2009 | Nilsson | |
| 2014/0209288 A1 * | 7/2014 | Simon | F25B 23/006 |
| | | | 165/281 |
| 2014/0247555 A1 | 9/2014 | Arvelo et al. | |
| 2016/0181178 A1 | 6/2016 | Meyer | |
| 2017/0146273 A1 | 5/2017 | Spitzner et al. | |
| 2017/0257981 A1 | 9/2017 | Weber | |
| 2018/0295754 A1 * | 10/2018 | Campbell | H05K 7/2079 |

OTHER PUBLICATIONS

Womac et al., "Correlating Equations for Impingement Cooling of Small Heat Sources With Single Circular Liquid Jets," ASME, 1993, 10 pages.

* cited by examiner

SYSTEMS AND METHODS FOR IMPLEMENTING INTELLIGENT COOLING INTERFACE ARCHIECTURES FOR COOLING SYSTEMS

FIELD

This invention relates generally to cooling interfaces for cooling systems and, more particularly, to intelligent cooling interface architectures and methods of using the same.

BACKGROUND

Before an electronic system starts up, its temperature may equalize or "soak" to an ambient temperature that currently surrounds the system. In some cases, this system startup temperature may be much lower than the operating temperature of the electronic system. An electronic system is considered to be "cold soaked" at startup when the system temperature is relatively low (e.g., below 0° C.). For some applications, electronic systems are required to initially startup at cold soaked temperatures that are −50° C. or lower, and thereafter be able to warm up and operate with full performance within reasonable length of time. However, some electronic systems are not able to startup below −20° C. or have even higher minimum startup temperatures.

Some heat load electronic systems (such as high power phased array systems) use components that run with high heat fluxes and produce high heat loads that require liquid cooling during operation to absorb and transport the waste heat to prevent excessively high operating temperature. These liquid-cooled electronic systems may be required to start up at temperatures as low as −54° C. but are not able to startup when cold soaked at temperatures as low of −50° C. or lower because the traditionally-used coolants either freeze or are so viscous they will not flow, and thus cannot transport generated heat away from an electronic system to cool it. In this regard, typically used coolants for this purpose include Polyalphaolefin (PAO), propylene glycol and water (PGW), and ethylene glycol and water (EGW). PAO will essentially not flow at −30° C. or below due to its high viscosity. The lowest freezing point mixture (60/40) of PGW freezes at −48° C. and does not support a −54° C. or lower soak temperature. The lowest freezing point mixture (60/40) of EGW begins freezing at −53° C., which marginally supports −54° C., but not a cold soak temperature below −60° C.

It is known to use heat generated by system electronic components to "warm-up" a phased array system until an acceptable operating temperature for the system is reached. This requires operation of the electronic components in a manner that does not produce a full heat load so as to prevent potential unstable operation of active electronic devices or damage to these components of the system, and so as not to exceed the heat transport capability of highly viscous or frozen coolant that may be present in the coolant lines at lower system temperatures. In addition, active electronic devices cannot be operated during this time at full capacity as the heat generated cannot be transported by a reduced coolant flow rate that exists due to the higher viscosity of the cold coolant. Further, during such a warm up procedure, transient temperature gradients may develop that can cause mechanical or structural failures induced by differential expansion rates within and among system components.

PAO, PGW, and EGW require the use of coldplates or coldwalls to which the heat producing devices are mounted so the heat can be absorbed by a flowing PAO, PGW, or EGW coolant stream that transports the heat out of the electronics system. Even though waste heat may be produced to warm the coolant in the coldwalls at low temperatures, the coolant will be unable to flow at temperatures where the coolant is frozen or highly viscous. As a result, the warming waste heat cannot be transported to affect warming of the entire loop.

SUMMARY

Disclosed herein are systems and methods for implementing intelligent cooling interface architectures for cooling systems that employ a heat transfer interface that thermally conducts heat between multiple separate coolant circulation loops. Using the disclosed systems and methods, a heat transfer interface may be advantageously managed based on monitored real time operational parameters (e.g., operating conditions such as pressures, mass flow rates, temperatures, etc.) within one or more of the separate coolant loops. In one exemplary embodiment, diagnostics and prognostics (D&P) for a multi-coolant loop cooling system may be performed in real time when the separate coolant loops of the cooling system are active, e.g., by measuring the pressures, mass flow rates and temperatures at one or more select locations in each of the separate loops, or alternatively in any one or more of the active coolant loops. Diagnostics and prognostics may be so performed to verify proper cooling system operation and to detect out-of-specification operational parameters based on expected or acceptable levels for these measurements in view of the heat load to be removed. In this way, the cooling system performance may be monitored to ensure proper operation and to anticipate and alert a user when cooling system operation is trending toward a failure condition.

In one embodiment, an intelligent cooling interface architecture may be implemented to ensure that temperature-sensitive electronics are always enabled to be powered on at or above a low temperature threshold limit (e.g., −10° C.) below which temperature-sensitive electronic devices such as high gain GaAs or GaN amplifiers may be unstable. In such an embodiment, a low temperature-sensitive electronic device of an electronic system may be warmed up from an initial temperature below the low temperature threshold limit (e.g., −10° C.) to a temperature at or above the low temperature threshold limit without turning on and/or using heat generated by the low temperature-sensitive electronic device itself. In such an embodiment, the low temperature-sensitive electronic device may only then be powered up after it has been warmed to the low temperature threshold limit, at which time it may be operated in at full power in a stable manner without oscillation.

Thus, in the embodiment of the above paragraph, the disclosed systems and methods may implement the multi-coolant loop cooling system architecture with an intelligent cooling interface between the first and second coolant loops to safely start the electronics system (e.g., a high power phased array or other type electronics system) in a stable manner when the high power phased array and coolant loops are cold soaked to a temperature of −60° C. or colder, and without using the electronics of the electronics system as a source of heat to warm the second coolant loop. One example of such an electronics system that may be safely started at such temperatures is a high power phased array system having greater than 40 kW peak radio frequency (RF) power output, and alternatively having from 40 kW to 100 kW peak RF power output. Another example of such an electronics system that may be safely started at such temperatures is a phased array system having a heat flux of greater than 30 Watts/in$^2$, and alternatively having a heat flux of greater than 100 Watts/in$^2$, where heat flux refers to: heat load (e.g., Watts of heat)/surface area through which the heat flows.

In one embodiment, the first coolant loop may employ a first coolant (e.g., having a relatively low viscosity of 156 cSt or less at a temperature −80° C. that will freely flow at a temperature of −40° C. with a viscosity of 6.32 cST while it is interfaced to the second coolant loop to enable heat transport around the first coolant loop to support warm-up of the electronic system within the first coolant loop at the time of system start-up or after the system has been dormant. In such an embodiment, the second coolant loop may be a coolant loop employing a second coolant (e.g., having a relatively higher viscosity of 274 cST or greater at a temperature of −40° C.) and that is essentially inoperative at lower temperatures (e.g., such as −50° C. or colder).

Using the above-described embodiment, system warm-up may be achieved without using the electronic system as a source of heat to warm the second loop. Rather, the electronics of the electronic system are only allowed to go active (turn on) at full capacity immediately or after the electronic system has been warmed to an acceptable operating temperature (e.g., such as equal to or above −10° C.). This helps ensure active devices of the electronics system will not go unstable or be damaged when operated at cold temperatures. This also helps ensure that there will be greatly reduced transient temperature gradients that would otherwise exist, and essentially eliminating differential expansion rate induced mechanical or structural failures.

In a further embodiment, condition and health of the cooling system may be monitored while it is operating in order to enhance the operational reliability of the heat removal system. In this way it is possible to monitor operational parameters of a multi-coolant loop cooling system in real time in order to know the operating condition of one or more of the multiple coolant loops, whether out-of-specification operational parameters are being approached, and the degree to which they are trending. Thus, the disclosed systems and methods may be implemented to ensure proper operation of multi-coolant loop cooling systems to remove waste heat produced by electronic systems, including complex electronic systems such as such as electronically-scanned phased arrays.

In one exemplary embodiment, the disclosed systems and methods may be employed to implement an intelligent cooling interface architecture for a cooling system that is configured to cool electronic systems, e.g., such as electronically scanned phased arrays. In one embodiment, such a cooling system may include a first coolant loop containing a first relatively low viscosity liquid coolant (e.g., less than or equal to 21 Centistoke (cSt) viscosity at −60° C.) that interfaces with a second coolant loop (containing a different type second liquid coolant having a relatively higher viscosity (e.g., greater than or equal to 1130 cSt at −60° C.). In such an embodiment, the disclosed systems and methods may be implemented to control the performance of the first coolant loop in response to sensed variations in operating characteristics (e.g., the temperature and/or coolant mass flow rate) of the second coolant within the second coolant loop. The disclosed systems and methods may also be implemented to allow heat to be transferred from the coolant of the first coolant loop to the coolant of the second coolant loop to assist the second coolant loop during system start-up, e.g., when both coolant loops are cold soaked at very low temperatures such as temperatures equal to or below −60° C.

In another exemplary embodiment, the disclosed systems and methods may be employed to implement an intelligent cooling interface architecture for a multi-coolant loop cooling system to provide a thermal "soft-start" mode to allow an electronics system to start-up at extremely low temperatures so that mechanical and structural failures due to thermal shock and/or induced by differential thermal expansion rates are minimized or eliminated. For example, the disclosed multi-coolant loop cooling system may be implemented to achieve successful electronic component startup for electronic systems such as high power phased arrays, not only at required cold soaked temperatures of −60° C. or lower than −60° C., but also at even lower temperatures such as −80° C. and less than −80° C. In one embodiment, such a thermal "soft-start" mode may be implemented without using the heat-producing electronic components of the electronic system as a source of heat, but instead using one or more heat sources (e.g., heater/s, heated hoses, etc.) within a first coolant loop of a multi-coolant loop cooling system to warm and circulate a first coolant of the first coolant loop to warm the electronic system with the electronic system components turned off and without using heat supplied by the electronic system components. This may be performed in one embodiment by ramping up the level of heat supplied to the coolant of the first coolant loop following a predefined temperature profile as described below.

In some cases, the amount of warming heat put into the first coolant loop will be limited by how fast (i.e., the maximum mass flow rate at which) the coolant in the first coolant loop may be circulated. This situation exists due the need to limit the fluid pressure within the first coolant loop to at or below an upper pressure level threshold. For example, in a case where warming of the coolant in the first coolant loop is initiated at a low temperature (e.g., such as −60° C. or below) the liquid first coolant will be more viscous than it will be when warmed to a higher temperature (e.g., such as −20° C. or above). Thus, to maintain about the same coolant pressure within the first coolant loop, the mass flow rate of the liquid coolant within the first coolant loop must be lower at coolant loop temperatures of −60° C. or below than the mass flow rate of the same liquid coolant within the first coolant loop when the temperature of the coolant loop is at −20° C. or above. At the same time, the ability to put heat into the flowing liquid coolant in the first coolant loop is limited by the available heat transfer to the coolant in the first coolant loop (e.g., via heat transfer between a heat source and the liquid coolant). The higher the viscosity of the liquid coolant, the lower the heat transfer coefficient. The lower the viscosity of the liquid coolant, the higher the heat transfer coefficient.

Therefore, during warming of the first coolant loop, the rate that heat can be put into the liquid of the first coolant loop can be increased as the coolant becomes less viscous. At the same time, the liquid coolant mass flow rate in the first coolant loop will increase during warming of the coolant when the upper allowable coolant pressure is held fixed. Thus in one embodiment, warm up time for the first coolant loop may be minimized by increasing (e.g., ramping up) the rate of heat transfer to the coolant in the first coolant loop as the temperature of the first coolant loop increases. In one embodiment, the heat level (or rate of heat transfer) put into the coolant of the first coolant loop may be controlled (and ramped up) based on the measured actual rate of change of the temperature of the coolant in the first coolant loop. In a further embodiment, the heat level (or rate of heat transfer) put into the coolant may be further controlled by also taking into account the real time first coolant loop pressure level and/or real time heat transfer capacity of the coolant in the first coolant loop for the conditions at that time.

In one embodiment, a processing device in the form of a microcontroller or other suitable programmable integrated circuit may react to monitored operational parameters (e.g., operating conditions such as mass flow rate, temperature, pressure, etc.) within either or both of the first and second coolant loops by controlling functions (e.g., power on/off, heat source, first coolant flow path selection, first coolant mass flow rate, etc.) of the first coolant loop based on these monitored second loop operational parameters. In one exemplary embodiment, the processing device may be programmed to control functions of the first coolant loop based on particular monitored operational parameters of the second coolant loop where it interfaces with the first coolant loop (e.g., at a heat exchanger).

As an example, during a thermal "soft start" mode, the warmed coolant circulated through the first coolant loop transports heat to all components of the first coolant loop to warm them. Since the electronic components systems are turned off during this initial warming at very cold temperatures, unstable operation and damage to active electronic devices of the electronic system may be avoided. In one embodiment, a microcontroller or other suitable processing device may be present to monitor and automatically control operation of the first coolant loop and set and vary the level of heat supplied by the heat source/s to the coolant of the first coolant loop. During the thermal "soft start" mode, the processing device may also control transfer of heat (e.g., via heat exchanger) from the first coolant loop to a second coolant loop of the cooling system such that no heat is removed from the first coolant loop until electronic components of the electronic system are warmed up to a threshold temperature and producing their own heat. At that time, the processing device may automatically control the cooling system to cause transfer of heat from the first coolant loop to the second coolant loop, and/or may turn off the heat source's that have been supplying heat to the first coolant loop. In this way, the electronic system may be turned on without waiting for the second coolant in the second coolant loop to be high enough to ensure stable operation of the electronic components of the electronic system.

In one embodiment, a microcontroller or other processing device may advantageously take advantage of heat source/s and flow of a first coolant in a first coolant loop of a cooling system to transport heat (e.g., via heat exchanger) to a second coolant (e.g., having higher freezing point than the first coolant) in a second coolant loop of the cooling system. This may be done, for example, in situations where the second coolant is not frozen but is too cold and viscous to exhibit a sufficient mass flow rate to suitably remove waste heat generated by the electronic system from the first coolant loop. In such an embodiment, the second coolant in the second coolant loop may be warmed to a sufficiently high temperature by the heat transfer from the first loop until mass flow rate of the second coolant becomes high enough to sufficiently remove the waste heat generated by the electronic system from the first coolant loop. This advantageously allows the second coolant to be warmed without direct use of electronically-generated heat from the electronic system. Further either of electronically-generated heat and/or heat produced using one or more heat sources (e.g. heater/s, heated hoses, etc.) may be utilized to heat the first coolant loop, which then may be employed to heat the second coolant of the second coolant loop.

In one embodiment, a processing device may be programmed to perform diagnostics and prognostics (D&P) in real time when the first and second coolant loops are active based on measured operational parameters, such as pressures, mass flow rates, and/or temperatures taken at select locations in either one or both of the first and second coolant loops. Such operational parameters may be read from sensor or transducer readings made at the select coolant loop locations and used to determine the real time current cooling system operating performance (e.g., such as heat removal operating capacity). Diagnostics and prognostics may be performed by the processing device to verify proper cooling system operation and/or to detect out-of-specification operational parameters based on a comparison between the determined cooling system performance and at least one of the measured heat load (e.g., measured from heat-producing electronic system components of a cooled electronic system) and/or the expected or acceptable system operating performance levels for these measurements in view of the heat load to be removed. Variances between the current cooling system operating performance and acceptable cooling system operating performance may be used by the processing device to make decisions about the health of the cooling system and possible actions (e.g., maintenance actions) to address the same.

In a further embodiment, the processing device may further report (e.g., via an alert to a human user) any cooling system operation that is detected by D&P to be out-of-specification so that the cooling system may be scheduled for a maintenance action. If the cooling system is operating in such way that may result in damage to the electronic system components being cooled, or to the coolant loops themselves, the entire cooling system may be automatically shut down or selectively controlled (e.g., off-loaded) by the processing device to operate with a lesser level of cooling performance. In this way, a processing device of the cooling system may be programmed to operate to know in real time the operating condition of each coolant loop and to know if out-of-specification operational parameters are being approached and the degree to which they are trending.

Thus, by using the disclosed multi-coolant loop cooling system architecture, the disclosed systems and methods may be implemented in a manner that does not require waste heat from electronic components to be transported to a flowing stream of PAO, PGW, or EGW coolant through coldplates or coldwalls to which the heat-producing electronic components are mounted. Since heat-producing electronic components are mounted within a first coolant loop containing a different first coolant that is not PAO, PGW, or EGW, waste heat is not required to heat a flowing PAO, PGW, or EGW coolant stream when the conduit lines, in-line filter, pump, etc. of a coolant loop are essentially plugged up with frozen or highly viscous PAO, PGW, or EGW coolant, and in which the warming waste heat cannot be transported to affect warming of the entire PAO, PGW, or EGW coolant loop. Rather, since the disclosed multi-coolant loop systems are implemented with electronic components within a first coolant loop that does not include a PAO, PGW, or EGW coolant, it is possible to achieve electronic system warm-up at cold-soaked temperatures of $-60°$ C. or colder (e.g., less than or equal to $-80°$ C.) without requiring heated PAO, PGW, or EGW coolant lines (and/or a heated filter assembly and a heated pump for such PAO, PGW, or EGW coolant). This in turn avoids burst problems in the first coolant loop that would otherwise exist with EGW or PGW as it freezes inside coldplates or coldwalls and/or metal coolant conduit lines.

In a further embodiment, the second coolant loop may also be prevented and/or protected from freezing, even in the case of a second coolant that is PAO, PGW, or EGW. For example, freezing of the second coolant loop may be avoided by using PAO as the second coolant, although PAO has extremely high viscosity that will essentially plug the second coolant loop at lower temperatures. Nevertheless, the second coolant loop may be warmed to achieve operable lower PAO viscosity using a very low second coolant mass flow rate under conditions where the heat put into the second coolant is greater than the heat lost by the second coolant loop to the external environment of the second coolant loop.

In the case of an EGW or PGW second coolant, both EGW and PGW will freeze within the second coolant loop at very low temperatures. For example, EGW will not yet be fully solid at temperatures down to −60° C., e.g., if an EGW second coolant is at about −55° C., the second coolant will not be frozen and may be pumped at a relatively low mass flow rate, e.g., through a heat exchanger with the first coolant loop where EGW second coolant may be warmed by heat transferred from the first coolant of the first coolant loop. However, at a temperature lower than −60° C., an EGW second coolant will freeze to plug the conduit/s of the second coolant loop, and potentially cause bursting of metal lines, fittings, and housings of the second coolant loop. A similar freezing problem will occur for a PGW second coolant within the second coolant loop, but at higher temperatures. To prevent second coolant freezing, the second coolant loop may be mounted (e.g., together with a heat exchanger) in a sufficiently warm environment that ensures that the second coolant does not freeze and becomes at most a highly viscous liquid within the second coolant loop. For example, the second coolant loop may be mounted in an interior equipment bay of an aircraft that is relatively warmer during flight while the first coolant loop extends to service (e.g., provide cooling for) an electronic system that is positioned in an aircraft location (e.g., wing nose, wing, etc.) that is relatively colder during flight.

In one respect, disclosed herein is a method, including: circulating a first coolant through a first coolant loop while circulating a different second coolant through a separate second coolant loop, the first coolant loop being in thermal contact with the second coolant loop across a thermal interface; operating one or more electronic system components in a turned on condition to produce a heat load that inputs heat to the circulating first coolant of the first coolant loop; removing heat from the circulating first coolant of the first coolant loop to the circulating second coolant of the second coolant loop across the thermal interface; sensing one or more operational parameters of the first coolant loop to determine at least one of a magnitude of the heat input by the electronic system components to the circulating first coolant or a magnitude of the heat removed by the thermal interface from the circulating first coolant to the circulating second coolant; and taking one or more control and/or user alert actions based on at least one of the determined magnitude of heat input or the determined magnitude of heat removal.

In another respect, disclosed herein is a method including: circulating a first coolant through a first coolant loop while circulating a different second coolant through a separate second coolant loop, the first coolant loop being in thermal contact with the second coolant loop across a thermal interface; operating one or more electronic system components in a turned on condition to produce a heat load that inputs heat to the circulating first coolant of the first coolant loop; removing heat from the circulating first coolant of the first coolant loop to the circulating second coolant of the second coolant loop across the thermal interface; and sensing one or more operational parameters of the first coolant loop, the operational parameters including a current temperature, current pressure and current mass flow rate of the first coolant within the first coolant loop. The method may also include iteratively performing the following sequence to warm the first coolant up to a first operating temperature set point whenever a current temperature of the first coolant is below the first operating temperature set point: a) circulating the first coolant at a maximum mass flow rate that does not result in a current first coolant pressure that exceeds a maximum working pressure of any components of the first coolant loop that are exposed to the circulating first coolant while sensing current temperature, pressure and mass flow rate of the circulating first coolant within the first coolant loop, b) then determining a level of heat to input to the circulating first coolant that is based at least in part on the sensed current mass flow rate and current temperature of the circulating first coolant, c) then controlling a heat source to produce and input the determined level of heat into the circulating first coolant, d) then iteratively repeating a) to c) until the current temperature of the first coolant is at or above the operating temperature setpoint, and e) then controlling the heat source to produce no heat whenever the current temperature of the first coolant is at or above the first operating temperature setpoint.

In another respect, disclosed herein is a system, including: a first coolant loop including a first pump circulating a first coolant and a separate second coolant loop including a second pump circulating a different second coolant, the first coolant loop being coupled in thermal contact with the second coolant loop across a thermal interface; one or more electronic system components operating to produce a heat load that inputs heat to the circulating first coolant of the first coolant loop that is removed from the circulating first coolant of the first coolant loop to the circulating second coolant of the second coolant loop across the thermal interface; one or more sensors sensing one or more operational parameters of the first coolant loop; a programmable integrated circuit receiving signals representative of the sensed operational parameters from the one or more sensors, the programmable integrated circuit being programmed to: use the sensed operational parameters to determine at least one of a magnitude of the heat input by the electronic system components to the circulating first coolant or a magnitude of the heat removed by the thermal interface from the circulating first coolant to the circulating second coolant, and take one or more control and/or user alert actions based on at least one of the determined magnitude of heat input or the determined magnitude of heat removal.

In another respect, disclosed herein is a system including: a first coolant loop including a first pump circulating a first coolant and a separate second coolant loop including a second pump circulating a different second coolant, the first coolant loop being coupled in thermal contact with the second coolant loop across a thermal interface; one or more electronic system components operating to produce a heat load that inputs heat to the circulating first coolant of the first coolant loop that is removed from the circulating first coolant of the first coolant loop to the circulating second coolant of the second coolant loop across the thermal interface; a heat source thermally coupled to input heat to the circulating first coolant of the first coolant loop, the heat source being different from the one or more electronic system components; one or more sensors sensing one or more operational parameters of the first coolant loop, the operational parameters including a current temperature, current pressure and current mass flow rate of the first coolant within the first coolant loop; and a programmable integrated circuit controlling the heat source and the first pump and receiving signals representative of the sensed operational parameters from the one or more sensors. The programmable integrated circuit may be programmed to iteratively perform the following sequence to warm the first coolant up to a first operating temperature set point whenever a sensed current temperature of the first coolant is below the first operating temperature set point: a) controlling the first pump to circulate the first coolant at a maximum mass flow rate that does not result in a sensed current first coolant pressure that exceeds a maximum working pressure of any components of the first coolant loop that are exposed to the circulating first coolant, b) then determining a level of heat to input to the circulating first coolant that is based at least in part on the sensed current mass flow rate and current temperature of the circulating first coolant, c) then controlling the heat source to produce and input the determined level of heat into the circulating first coolant, d) then iteratively repeating a) to c) until the current temperature of the first coolant is at or above the operating temperature setpoint, and e) then controlling the heat source to produce no heat whenever the current temperature of the first coolant is at or above the first operating temperature setpoint.

DESCRIPTION OF ILLUSTRATIVE EMBODIMENTS

Figure 1:
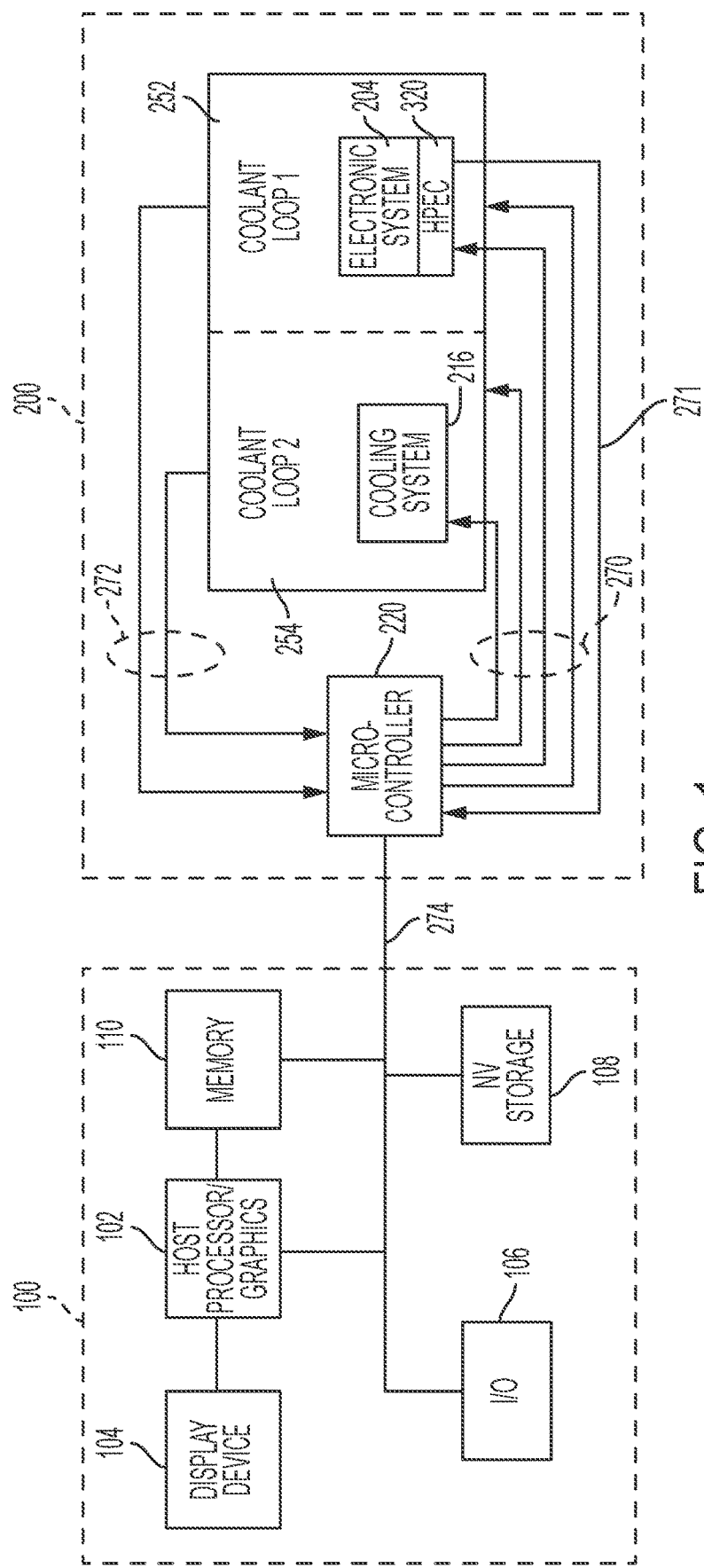
FIG. 1 illustrate a block diagram of a multi-coolant loop cooling system that is coupled in data communication with data processing and user interface components according to one exemplary embodiment of the disclosed systems and methods.

FIG. 1 is a block diagram showing architecture 200 of a multi-coolant loop cooling system that is coupled in data communication with data processing and user interface components 100. As shown, cooling system architecture 200 includes a processing device 220 (e.g., a programmable integrated circuit such as a microcontroller as shown) that is coupled to monitor and control components of a first coolant loop 252 including an electronic system assembly 204 and a second coolant loop 254 including a remote platform or system level cooling system 216, details and operation of which will be described further herein. As shown, processing device 220 is coupled in data communication with components 100 by one or more wired data buses 274, although wireless data communication is also possible. It will be understood that that data processing and user interface components 100 may be separate discrete components or may, for example, be part of a computer system such as a laptop computer, tablet computer, desktop computer, convertible computer, smart phone, etc. In this regard, it should be understood that the configuration of FIG. 1 is exemplary only, and that the disclosed systems and methods may be implemented with other configurations and/or combinations of components, and that the disclosed systems and methods are not restricted to including only those components shown in FIG. 1 and described further below.

In FIG. 1, data processing and user interface components 100 include at least one host processing device 102 (e.g., a programmable integrated circuit such as AMD or Intel-based CPU such as Itanium or any other type of suitable host processing device), one or more buses or communication media 274 (e.g., PCIe bus, USB, SMBus, SATA, other appropriate data buses such as memory bus, etc.), non-volatile persistent storage 108 (e.g., hard disk drive/s, solid state drive/s "SSDs", Flash memory, and or other non-volatile memory), and system volatile memory (e.g., DRAM) 110. In one embodiment, non-volatile persistent storage 108 may be so coupled to bus 274 to provide permanent storage for host processing device 102 and/or cooling system processing device 220. The host processing device 102 may execute a host operating system (OS) such as Microsoft Windows-based OS, Linux-based OS, Android OS, iOS, etc. Bus/es 274 provides a mechanism for the various components of each of components 100 to communicate and couple with one another, as well as to communicate with components of multi-coolant loop cooling system architecture 200.

As further shown in FIG. 1, data processing and user interface components 100 include a display device 104 (e.g., LCD display, LED display, etc.) configured to display information (e.g., via a user interface) to a human user. In the illustrated embodiment, host processing device 102 may include integrated graphics capability (e.g., in a system-on-chip configuration), although in other embodiments a separate graphics processing unit (GPU) may be coupled between display device 104 and host processing device and/or bus 274. Also present are input/output (I/O) components 106 (e.g., mouse, keyboard, touchpad, etc.) for receiving inputs from a human user and to enable the user to interact with processing devices 102 and 220, and with application programs or other software/firmware executing thereon. Additional components such as a keyboard microcontroller may also be present between I/O devices 106 and host processing device 102. In one exemplary embodiment, host processing device 102 may be programmed to operate (e.g., via software application) as a data interface between cooling system processing device 220 and each of I/O components 106 and display device 104, e.g., to relay user input information to cooling system processing device 220 and to display alert information (and/or to display real time coolant loop operational parameters) from cooling system processing device 220 on display device 104. It will be understood that in alternate embodiments, functions and tasks of host processing device 102 and cooling system processing device 220 may be both performed by a single processing device 102 or 220.

Figure 2:
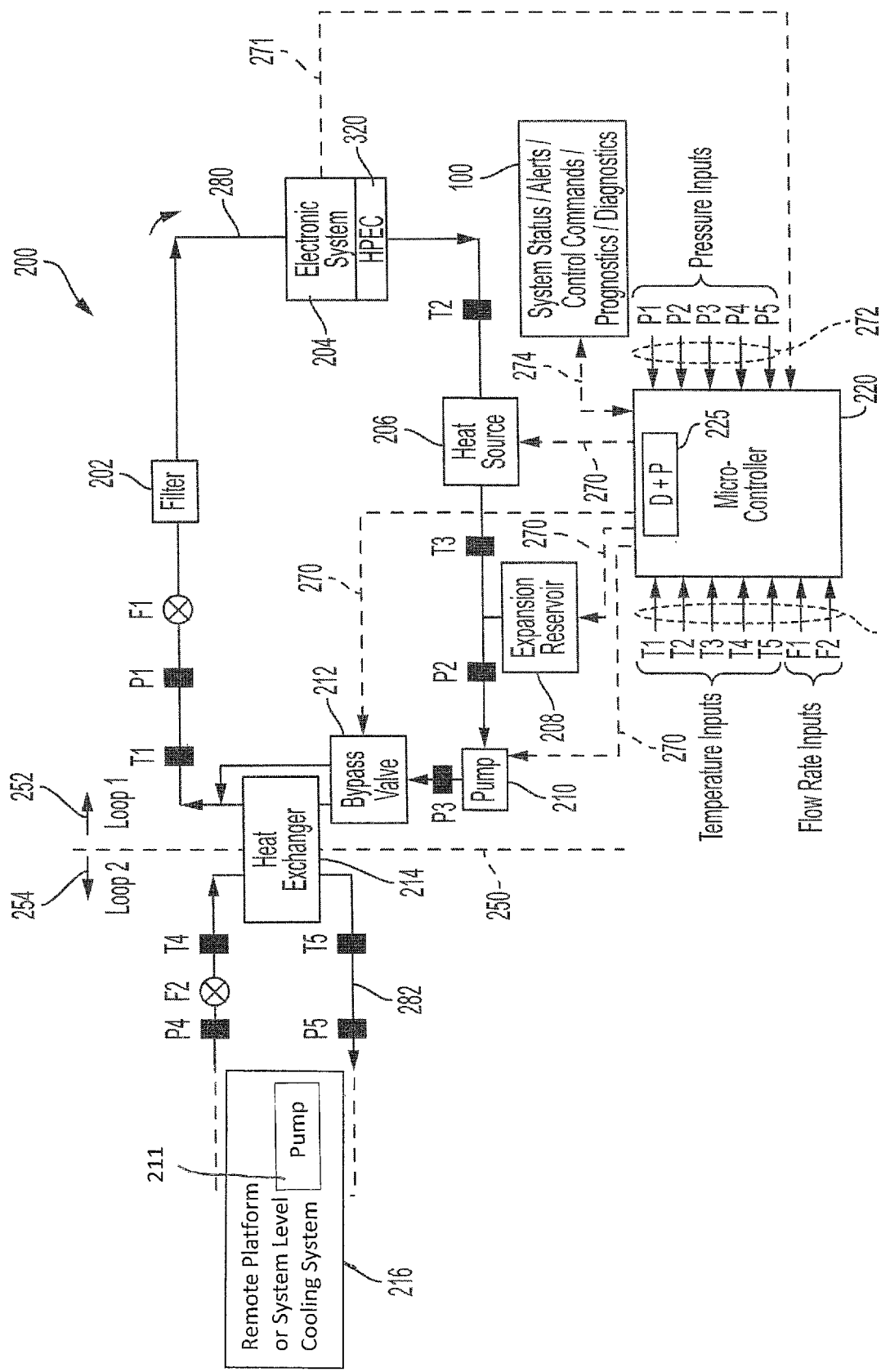
FIG. 2 illustrates a multi-coolant loop cooling system architecture according to one exemplary embodiment of the disclosed systems and methods.

FIG. 2 illustrates a multi-coolant loop cooling system architecture 200 as it may be configured with multiple coolant loops according to one exemplary embodiment of the disclosed systems and methods. Exemplary applications for cooling system architecture 200 include, but are not limited to, electronically scanned phased array systems, chassis mounted electronics, computer servers, densely packaged electronics and processors, laser systems, and optical systems.

As shown in FIG. 2, a first coolant loop 252 is thermally interfaced with a second coolant loop 254 through a heat exchanger 214. Heat exchanger 214 may be of any suitable design (e.g., shell and tube, compact, etc.) that is suitable for transferring heat between a first fluid circulating around a first closed coolant loop 252 and a second fluid simultaneously circulating around a second closed coolant loop 254, i.e., without allowing any intermixing to occur between the first and second fluids of the separate coolant loops 252 and 254. In the embodiment of FIG. 2, first coolant loop 252 contains a first fluid within a conduit 280 (e.g., metal, braided rubber hose, or plastic tubing, piping, etc.) that couples the below-described separate components of first coolant loop 252 together in sealed fluid communication.

A multi-coolant loop system 200 may be implemented in a variety of different environments and applications. In one exemplary embodiment, first coolant loop 252 may be contained or otherwise exposed to an environment that is relatively colder than an environment to which second coolant loop 254 is exposed. For example, multi-coolant loop system 200 may be supported on an airborne or spaceborne vehicle (e.g., such as fixed-wing aircraft, helicopter, lighter-than-air vehicle, spacecraft, etc.) with first coolant loop 252 and its electronic system 204 exposed to the temperature of the external atmosphere or space, and with second coolant loop 254 contained within a relatively warmer compartment of the vehicle that is sufficiently warm to ensure that the second coolant 254 two does not freeze and is at most only plugged with a high viscosity second coolant, e.g., second coolant loop 254 may be positioned (e.g., with heat exchanger 214) inside a relatively warmer aircraft interior bay while first coolant loop 252 is positioned at a relatively colder aircraft location such as within the wing or nose of the aircraft.

In one embodiment, the first fluid in the first coolant loop 252 may be a liquid coolant having a dielectric constant of less than 10, and having a relatively low viscosity at $-80°$ C. or lower. One example of a suitable such fluid is Galden HT135 (a nonflammable liquid with a pour point of $-100°$ C. and exhibiting a low viscosity at cold temperatures (21 cSt at $-60°$ C.). Other suitable such first fluids include, but are not limited to, Novec 7300, Novec 7500, Novec 7600, Galden HT80, Galden HT110, Galden 170, Galden 200, 3M Fluorinert FC84, 3M Fluorinert FC 770, etc.

In one embodiment, the second fluid in the separate second coolant loop 254 may be a liquid coolant having a higher viscosity than the coolant in loop 252. Examples of such second fluids include, but are not limited to, PAO (e.g., viscosity of 1130 cSt at $-60°$ C.), PGW, EGW, etc. Further information regarding coolants for first and second coolant loops may be found in United States Patent Application Publication Number 2017/0257981 which is incorporated herein by reference in its entirety for all purposes.

Employing a first coolant fluid in the first coolant loop 252 that has a lower viscosity at the same temperature than the second coolant fluid in the second coolant loop 254 allows the electronic components of electronic system assembly 204 to start up at temperatures where the second coolant fluid of the second coolant loop is still frozen or too viscous to effectively circulate thought second coolant loop 254. For example, assume Galden HT135 is employed as the first coolant in the first coolant loop 252 in combination with one of PAO, EGW or PGW employed as the second coolant in the second coolant loop 254. In such an example, Galden HT135 has a viscosity of 10.7 centistokes (cSt) at $-50°$ C., while PAO has a viscosity of 568 cSt (or 53 times that of Galden HT135) at $-50°$ C., meaning that Galden HT135 first coolant is much easier to pump through a coolant loop than is PAO at $-50°$ C. and lower temperatures, thus allowing for start-up of electronic components of electronic system assembly 204 at temperatures of $-60°$ C. or lower, regardless of the high viscosity of the PAO second coolant. Further, Galden HT135 remains liquid remains liquid at $-100°$ C. and will not freeze at a temperature of $-60°$ C., while both a PGW and EGW will be frozen at $-60°$ C.

During cooling system operation, the first fluid is circulated around the first coolant loop 252 by a pump 210 (e.g., centrifugal pump or positive displacement pump) that operates under the control of host processing device 220 or other suitable processing device 220. In particular, pump 210 circulates the first fluid between an electronic system assembly 204 and the heat exchanger 214, where heat is transferred from the first fluid to a second and different type of coolant fluid that is contained and circulated within second coolant loop 254. As shown, the first fluid may be provided from pump 210 to a bypass valve 212 having an actuator (e.g., solenoid valve, etc.) that is controlled by processing device 220 to selectively partition the first flow into two streams through and around heat exchanger 214 to control the recombined two stream to a desired temperature level.

Still referring to the embodiment of FIG. 2, the first fluid is provided to cool or heat heat-producing electronic system components (HPEC) 320 of the electronic system assembly 204 after the first fluid passes through or around heat exchanger 214. Electronic system assembly 204 may include HPEC of an electronic system such as a high powered phased array (e.g., a phased array that produces more than 40 kW of peak RF output power that requires a coolant within a controlled temperature range to ensure stable and calibrated operation), or any other electronic system having heat-producing electronic components 320. Examples of specific heat-producing electronic components 320 of an electronic system include, but are not limited to, power supplies, microcontrollers or other processing devices, high gain GaAs or GaN amplifiers, low noise amplifiers, phase shifters, RF switches, optical switches, and optical components.

Electronic system assembly 204 may be configured in any suitable manner within first coolant loop 252 to allow thermal conduction of heat between the heat-producing electronic system components 320 of electronic system assembly 204 and the first coolant fluid of the first coolant loop 252. For example, an electronic system assembly 204 may be configured as a jet impingement cooling system that includes a fluid-tight enclosure containing one or more heat-producing components 320 that are cooled therein by impinging jets of first fluid in a manner as described in United States Patent Application Publication Number 2017/0257981, which is incorporated herein by reference in its entirety for all purposes. As another example, electronic system assembly 204 may be configured as an evaporator assembly including enclosure/s in the form of a vapor production chamber or chambers thermally coupled to heat-producing electronic components 320, and into which the first fluid is injected in the liquid phase where it absorbs heat from the electronic system components and is vaporized as described in United States Patent Application Publication Number 2017/0146273, which is incorporated herein by reference in its entirety for all purposes. In other embodiments, electronic system assembly 204 may be configured to cool heat-producing electronic components 320 in any other suitable manner, such as using one or more enclosures that include heat-producing electronic components 320 mounted to a heat transfer mounting component such as a cold plate or cold wall, rather than the submerged jet impingement enclosure or evaporator assembly enclosures.

In one embodiment, first coolant loop 252 may include a flow divider and combiner to distribute the first fluid to multiple electronic system assemblies positioned therebetween that each include heat-producing electronic system component/s 320, e.g., in a manner such as described in United States Patent Application Publication Number 2017/0257981, which is incorporated herein by reference in its entirety for all purposes.

As shown, first coolant loop 252 may also include a heat source 206 (e.g., such as controllably heated hoses, flow through heater assembly, in-line fluid warmer, in-line circulation heater etc.) that may be controlled by processing device 220 to provide a selected amount of heat (or no heat) on demand to the first fluid within coolant loop 252. by processing device 220. Other optional components that may also be present within first coolant loop 252 include, but are not limited to, optional expansion reservoir 208 (that may be present to respond to changes in the volume of first coolant in first coolant loop 252 caused by changes in the temperature of the first coolant) and/or an optional filter 202 (e.g., such as a 40 micron rated sintered metal or mesh filter) that may be coupled as shown (or anywhere else within first coolant loop 252) to trap and remove any entrained impurities, particulate matter and/or other foreign materials from the circulated first fluid.

As further shown in FIG. 2, temperature sensors (T1-T3), pressure sensors (P1-P3) and/or mass flow rate sensors (F1) may be provided at selected locations with coolant loop 252 to sense real time operating conditions of the first fluid within coolant loop 252, and to provide wired or wireless signals 272 representative of these real time conditions as inputs to processing device 220. As will be described further herein, processing device 220 may be programmed to control operation of components 206, 208, 210 and 212 based at least in part on these real time sensor inputs. Examples of suitable temperature sensors include, but are not limited to, thermocouples and resistance thermal detectors (RTDs) mounted in well assemblies, etc. Examples of suitable pressure sensors include, but are not limited to, piezoresistive, bourdon tube, diaphragm, and bellows gauges, etc. Examples of suitable mass flow rate sensors include, but are not limited to, paddle wheel or venture-type flow meters, vortex or positive displacement or ultrasonic flow sensors, etc. It will be understood that the location of any given sensor within first coolant loop 252 may vary, and/or that a first coolant loop 252 need not include the same number and/or types of sensors illustrated in FIG. 2, e.g., a first coolant loop 252 may include more or less than three temperature sensors, more or less than three pressure sensors, and/or more than one mass flow rate sensor. Moreover, it is not necessary that a first coolant loop 252 include each of temperature, pressure and mass flow rate sensors, but rather may include only a subset of one or two of these types of sensors. Moreover, other types of sensors may additionally or alternatively be present to monitor operational parameters within the first coolant loop 252, e.g., such as fluid density sensors, fluid analysis sensors (e.g., such as a Fluid Property Sensor Module part number FPS2800B12C4 available from TE Connectivity Measurements Specialties), etc.

Still referring to FIG. 2, a second coolant loop 254 is provided that contains a second fluid within a conduit 282 (e.g., metal or plastic tubing, braided rubber hoses, piping, etc.) that couples heat exchanger 214 to a remote platform or system level cooling system 216 in sealed fluid communication. Examples of such a cooling system 216 include, but are not limited to, an environmental conditioning unit or coolant loop on a ship or aircraft, a roof top chiller, a source of water from a river or lake, or a special built or commercial refrigerated cooling system. During cooling system operation, the second fluid is cooled by system 216 and may be circulated around the second coolant loop 254 by a pump 211 within system 216 that is coupled to feed fluid into conduit 282 or alternatively a standalone pump coupled inline within conduit 282. In particular, the second fluid is circulated between cooling system 216 and the heat exchanger 214, where heat is transferred from the first fluid in the first coolant loop 252 to the second fluid in the second coolant loop 254. Heat is then removed from the heated second fluid by the cooling system 216 before the cooled second fluid is returned to the heat exchanger 214.

As further shown, second coolant loop 254 may also include pressure sensors (P4-P5), temperature sensors (T4-T5) and mass flow rate sensor (F2) provided at selected locations within coolant loop 254 to sense real time operating conditions of the second fluid within coolant loop 254, and to provide signals representative of these real time conditions as inputs to processing device 220. As will be described further herein, processing device 220 may be programmed to control operation of components 206, 208 and 210 based at least in part on these real time sensor inputs together with the sensor inputs from first coolant loop 252. The sensors of second coolant loop 254 may be of the same types described in relation to first coolant loop 252. Moreover, as with first coolant loop 252, the location of any given sensor within second coolant loop 254 may vary, and/or a second coolant loop 254 need not include the same number and/or types of sensors illustrated in FIG. 2. Further, it is not necessary that a second coolant loop 254 include each of temperature, pressure and mass flow rate sensors, but rather may include only a subset of one or two of these types of sensors. Additionally, similar to that described in relation to first coolant loop 252, other types of sensors may additionally or alternatively be present to monitor operational parameters (e.g., operating conditions such as pressures, mass flow rates, temperatures, etc.) of the second coolant loop 254.

In one embodiment, processing device 220 may be programmed to manage operation of multi-coolant loop cooling system architecture 200 by controlling functioning of first coolant loop 252 by reacting to monitored operational parameters of first coolant loop 252 and second coolant loop 254, e.g., where second coolant loop 254 interfaces with first coolant loop 252. For example processing device 220 may monitor and use measured temperatures and mass flow rate of the first coolant within first coolant loop 252 to vary setting of the heat exchanger flow bypass valve 212 to control the measured temperature at temperature sensor T1, e.g., to match a set point temperature level or to stay within a set temperature range. The processing device may use sensed temperatures from temperature sensors T1, T2, and T3 and the sensed mass flow rate from mass flow rate sensor F1 to monitor the health of first coolant loop 252, e.g., in a manner described further in relation to FIG. 5. In one embodiment, processing device 220 may use pressure sensed by two or more pressure sensors (such as pressure sensors P1 and P2) to monitor the pressure drop of the first coolant across the heat exchanger 214 and in the first coolant loop 252 itself. This may be done to ensure pressures within the first coolant loop 252 are maintained within acceptable predefined pressure bounds (e.g., between a predefined maximum pressure level and a predefine minimum pressure level), and to set the speed of pump 210 and resulting first coolant mass flow rate within first coolant loop 252 to ensure that there is not an over pressure condition within first coolant loop 252 and/or to ensure that the first coolant mass flow rate is maintained within predefined mass flow rate bounds (e.g., between a predefined maximum mass flow rate level and a predefine minimum mass flow rate level). This control of first coolant pressure and mass flow rate will also ensure that a predefined maximum allowable first coolant pressure within first coolant loop 252 is not exceeded as the first coolant warms and becomes less viscous.

In one embodiment, multi-coolant loop cooling system architecture 200 may enable a thermal "soft start" warm-up of heat-producing electronic system components (HPEC) 320 of the electronic system assembly 204 using heat source 206 to warm the HPEC 320 to an acceptable temperature for startup. In this embodiment, processing device 220 may control heat source 206 to ramp up the level of heat applied to first coolant within first coolant loop 252, e.g., following a predetermined temperature profile. It is also possible that processing device 220 may monitor operational parameters within first coolant loop 252 (e.g., using system temperature, pressure and mass flow rate sensors of FIG. 2) and use the monitored operating parameters to control operation of first coolant loop 252 while also controlling heat source 206 to apply a selected level of heat to the first coolant. As previously described, the first coolant will flow in the first coolant loop 252 when initially at −60° C. or colder, and therefore heat produced by heat source 206 during the soft-start warm up can be transported to all components (including HPEC 320) of first coolant loop 252 to warm them. Further, the HPEC 320 do not have to be operated and used to produce heat used for warming of first coolant loop 252 at this time, thus preventing active HPEC electronic devices from being potentially damaged or operated in an unstable manner. Further, since HPEC 320 are not used to generate heat for warming first coolant loop 252, there will be greatly reduced transient temperature gradients essentially eliminating differential expansion rate induced mechanical or structural failures.

In a further embodiment, processing device 220 may command the heat exchanger bypass flow control valve 212 to route first coolant around the heat exchanger 214 so that heat is not removed from first coolant loop 252 to second coolant loop 254 during the soft start warm-up time. When the HPEC 320 are sufficiently warm enough (warmed to a threshold minimum operating temperature) and are being operated to produce their own heat, the processing device 220 may turn off heat source 206 and control bypass valve 212 to route first coolant through heat exchanger 214 so that heat can be removed from first coolant loop 252 by transferring this heat to second coolant loop 254.

In one embodiment, heat transfer capabilities for heat source 206 may be previously determined (e.g., during system design or fabrication, during system field calibration, etc.) prior to initiating a soft-start warmup procedure during system field operation. An example of predetermined heat transfer capabilities is a relationship used for setting the warming heat load to be produced by heat source 206 based on the current temperature of first coolant (as a measure of coolant viscosity), the current first coolant mass flow rate, and the allowable heat flux within heating devices (e.g., electric heating elements, heated hoses, etc.) of heat source 206 for those conditions. The predetermined heat transfer capabilities may be stored (e.g., as a lookup table) in non-volatile storage 108. Using these previously determined heat transfer capabilities for the heat source 206, processing device 220 may calculate or otherwise determine the maximum allowable amount of heat (e.g., in units of Watts' that can currently be transferred from heat source 206 to warm the first coolant of first coolant loop 252 up to a desired operating temperature set point of the first coolant loop during operation of multi-coolant loop cooling system 200, e.g., based on (or as a function of) the real time temperature and mass flow rate of the first coolant entering the heat source 206. In this regard, the amount of heat that is transferred into the first coolant loop 252 will be different for different mass flow rates and temperatures of the first coolant.

For example, in one embodiment, the current temperature of the first coolant may be used as an indicator of the viscosity of the first coolant, e.g., by entering the temperature into a viscosity-versus-temperature relationship to determine the viscosity of the first coolant at the current temperature. A viscosity-versus-temperature relationship may be predetermined for the first coolant (e.g., based on empirical measurement) and stored (e.g., as a lookup table, an equation such as: viscosity=$(4.62 \times 104)*((T+93)^{-2.23})$ (cSt, °C.), or other suitable data relationship) in non-volatile storage 108. This table may be accessed in real time by processing device 220 to determine the real time viscosity of the first coolant based on the sensed real time temperature of the first coolant.

In one embodiment, knowing the current real time first coolant viscosity at temperature T2 and mass flow rate F1 then allows the processing device 220 to determine in real time the amount of heat that can be currently transferred from the heat source 206 to the first coolant based on real time viscosity and mass flow rate of the first coolant in the first coolant loop 252. In this regard, given the same coolant mass flow rate, more heat can be transferred to the flowing first coolant the lower the viscosity of the first coolant. At the same time, given the same coolant viscosity, more heat can be transferred to the flowing first coolant the higher the mass flow rate of the first coolant in the first coolant loop 252. Thus, a lookup table or other data relationship of heat transfer capability as a function of first coolant viscosity at temperature T2 and mass flow rate F1 may be predetermined for the first coolant loop 252 (e.g., based on empirical measurement), and stored in non-volatile storage 108.

This relationship may be iteratively accessed in real time and used by processing device 220 to control warming of the first coolant to a desired operating temperature set point within the first coolant loop 252. Processing device 220 may also set the current level of heat to be produced (e.g., in units of Watts) by heat source 206 to be equal to the determined current level of heat that can be accepted (e.g., absorbed) by the first coolant from the heat source 206. At the same time, processing device 220 may control the speed of pump 210 such that pressure P1 will not exceed a predetermined maximum pressure threshold level, e.g., stored in non-volatile storage 108. This predetermined maximum pressure threshold level may be set at a value that is does not exceed the maximum working pressure of any of the conduits and other components within first coolant loop 252.

Figure 4:
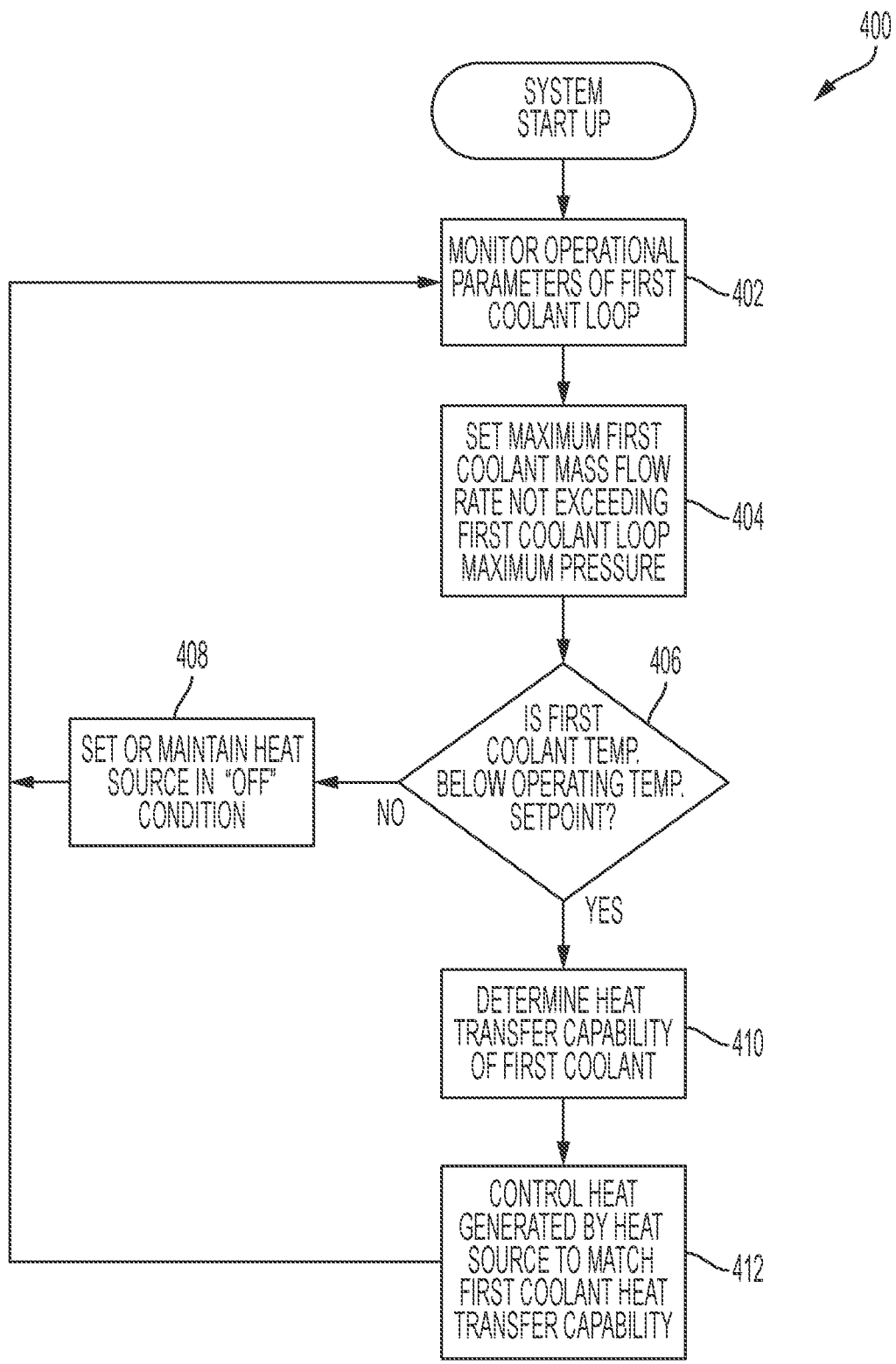
FIG. 4 illustrates methodology according to one exemplary embodiment of the disclosed systems and methods.

During operation, processing device 220 may continuously or otherwise iteratively monitor temperatures (T1, T2, T3), pressures (P1, P2, P3) and mass flow rate (F1) of first coolant in first coolant loop 252, e.g., as shown in step 402 of system startup methodology 400 of FIG. 4. In the embodiment of FIG. 4, processing device 220 may command pump 210 in step 404 to produce the maximum mass flow rate of first coolant that does not result in a pressure P1, P2 and/or P3 that exceeds the stored predetermined maximum pressure threshold level. Then in step 406, processing device 220 may determine whether the temperature of the first coolant is below the operating temperature set point. If not, processing device 220 commands the heat source 206 to be off (or maintains the heat source 206 in the off condition) in step 408 and methodology 400 returns to step 402 and iteratively repeats. Heat source 206 will thus remain turned off until the temperature of the first coolant drops below the operating temperature set point.

When the current temperature of the first coolant is found to be below the operating temperature set point in step 406, then in step 410 processing device 220 then determines the heat transfer capability of the first coolant (e.g., from a stored relationship of heat transfer capability as a function of first coolant viscosity and mass flow rate). Then in step 412 processing device 220 may compare current heat production of heat source 206 to the determined heat transfer capability of the first coolant from step 410 to determine if more (or less) heat should be put into the first coolant from the heat source 206 than is currently being produced by heat source 206 in order to match the determined heat transfer capability of the first coolant from step 410. Also in step 412, processing device 220 commands heat source 206 to add more (or less) heat accordingly to match the determined heat transfer capability of the first coolant from step 408, and methodology 400 iteratively repeats to step 402. As such, upon cold startup of system 200, processing device 220 controls warming of the circulating coolant until the desired temperature set point of the first coolant loop is reached in step 406, after which processing device 220 commands the heat source 206 to turn off and turn on as needed to maintain first coolant temperature at or above the minimum first coolant temperature set point.

Given the above iterative methodology 400 of FIG. 4 and stored relationships between first coolant temperature, viscosity, mass flow rate and heat transfer capability, processing device 220 may in one embodiment vary heat level produced by heat source 206 upward or downward as needed, to warm the temperature of the first coolant during system startup to a desired (or otherwise designated) operating temperature set point based on the real time measured mass flow rate and temperature of the first coolant within the first coolant loop 252. At the same time, processing device 220 may iteratively increase first coolant mass flow rate (during successive iterations of step 404) as viscosity of the first coolant decreases with warming temperature of the first coolant. In turn, more heat can then be added by the heat source 206 to the first coolant in successive iterations of step 412 because the heat transfer capability has improved due to the higher mass flow rate and lower viscosity of the first coolant.

To summarize, from the various sensors and stored data relationships, processing device 220 may determine the warming and viscosity decrease of the first coolant during initial system startup (e.g., at cold soaked condition) and adjust the speed of pump 210 to vary the mass flow rate of the first coolant accordingly. Because the first coolant viscosity becomes lower after some warming of first coolant has occurred, processing device 220 will command the pump 210 to increase the first coolant mass flow rate up to a new maximum mass flow rate that is limited by the predetermined maximum allowable pressure P1. Now that the first coolant mass flow rate F1 has increased (and the first coolant viscosity has decreased), processing device 220 then will determine in step 410 the heat transfer capability of the first coolant (e.g., from a stored relationship of heat transfer capability as a function of first coolant viscosity and mass flow rate). Then processing device 220 commands heat source 206 to add more heat accordingly in step 412 if more heat can now be put into the first coolant from the heat source 206 (e.g., more heat can be added because the heat transfer capability has improved due to the higher mass flow rate and lower viscosity of the first coolant). Otherwise heat output of heat source 206 is left unchanged. When the desired temperature set point of the first coolant loop is reached in step 406, processing device commands the heat source 206 to turn off in step 408, and then later to turn on in later iterations as needed to maintain first coolant temperature at or above the minimum first coolant temperature set point.

It will be understood that first coolant warming may be an automatic process under control of processing device 220, and/or it may be performed following preprogramed heat load and pump speed profiles. For example, in one embodiment, micro-controller 220 may command the pump 210 to run at a predetermined speed and simultaneously command the heat source 206 to a produce a predetermined level of heat, with both pump speed and heat source heat level being selected based on the initial temperature of the first coolant, the first coolant mass flow rate, and the time since warming from heat source 206 began. As time increases from the time the warming began, the speed of the pump (210) and/or the level of heat produced by the heat source (206) may increase in a predetermined manner, e.g., following programed ramps (e.g., corresponding to linear, quadratic, exponential, logarithmic curve form) which may be stored as lookup table values in one embodiment.

In one embodiment, a second coolant within second coolant loop 254 may be warmed using heat transferred from the heat source 206 of first coolant loop 252. This may be needed or desired, for example, under an operating condition (e.g., below −50° C.) where a second coolant (e.g., such as EGW) within second coolant loop 254 is sufficiently cold that it is not suitable for removing electronic waste heat transferred from first coolant loop 252 via heat exchanger 214 due to insufficient mass flow rate caused by relatively high viscosity of the second coolant at the current temperature, while at the same time the first coolant (e.g., Galden HT135) retains sufficiently low viscosity and high enough mass flow rate to transfer heat to a core of heat exchanger 214 from heat source 206. In such an embodiment, processing device 220 may control flow of first coolant within first coolant loop 252 by setting bypass valve 212 to route first coolant through the core of heat exchanger 214 so as to transport heat produced by heat source 206 to the core of heat exchanger 214. Doing so allows the second coolant (e.g., EGW) in second coolant loop 254 to be warmed using heat generated by the heat source 206 in first coolant loop 252 and transferred to the second coolant loop 254 through heat exchanger 214 to warm the second coolant to a sufficiently high temperature (e.g., second coolant loop operating temperature set point) that the second coolant mass flow rate is great enough to remove the electronic heat load produced by HPEC 320.

In the above example, EGW must be warmed to a second coolant loop operating temperature set point of about −50° C. or warmer to have sufficiently low viscosity to be effectively pumped within second coolant loop 254 to transport the electronic heat load. The advantage of this embodiment is that the second coolant in second coolant loop 254 may be warmed without using electronically-generated heat from HPEC 320 by making use of the heat source 206 within first coolant loop 252. In one embodiment, processing device 220 may monitor operational parameters (temperature, pressure, mass flow rate) within both first and second coolant loops to ensure as rapid a warm up as possible may be achieved. Further, HPEC 320 within first coolant loop 252 may be turned on sooner than would be otherwise possible since it is not necessary to wait for the temperature of the second coolant within the second coolant loop 254 to be warmed to be high enough to ensure stable operation of the HPEC 320.

In an alternative embodiment, heat may be drawn from second coolant of second coolant loop 254, for example, in the case where the current temperature of the first coolant is determined (e.g., via sensors T1, T2 and/or T3) to be cold (e.g., below a predefined minimum threshold temperature) and/or the first coolant is determined (e.g., via sensor F1) not to be flowing within first coolant loop 252 at the current first coolant temperature (despite pump 210 being turned on), while at the same time the second coolant is determined (e.g., via sensor F2) to be flowing within second coolant loop 254 and the current temperature of the second coolant is determined (e.g., via sensors T4 and/or T5) to be sufficiently warm (e.g., above a predefined minimum threshold temperature) and/or is determined to be warmer relative to the first coolant current temperature so that it is capable of providing heat to first loop 252 via heat exchanger 214. This may be done in one embodiment without using heat from heat source 206 by starting pump 210 within the first coolant loop 252 while the warmer second coolant is circulating within the second coolant loop 254 so as to warm the first coolant using heat drawn from the second coolant across heat exchanger 214 while the second coolant is circulating in the second coolant loop 254. As the first coolant warms, it will begin to circulate and heat source 206 may then be optionally turned on (where present). In one embodiment, D&P 225 may make use of both first coolant loop sensors (T1, T2, T3, P1, P2, P3 and/or F1) and second coolant loop sensors (T4, T5, P4, P5 and/or F2).

Figure 3:
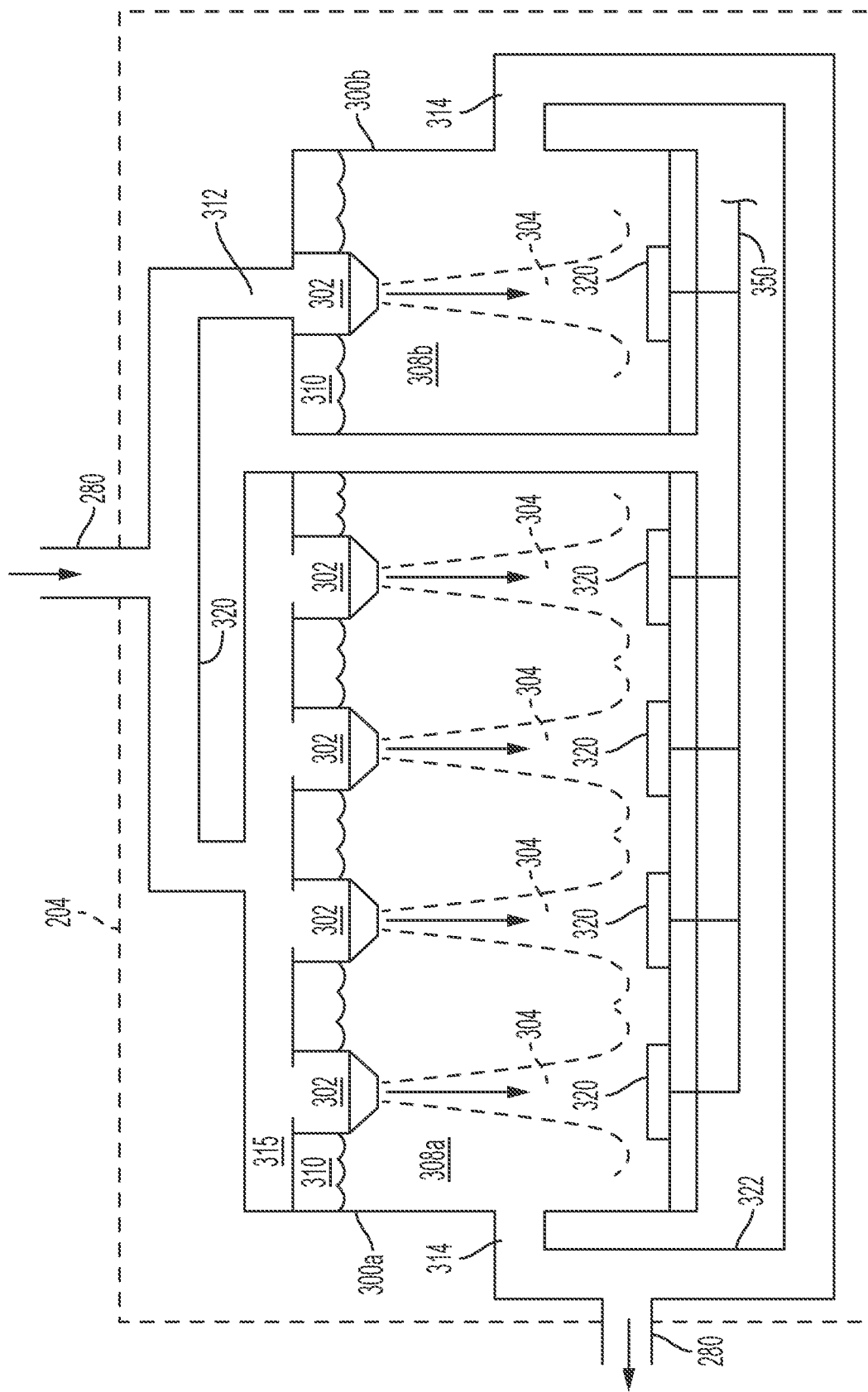
FIG. 3 illustrates an electronic system assembly according to one exemplary embodiment of the disclosed systems and methods.

FIG. 3 illustrates one exemplary embodiment of electronic system assembly 204 that includes multiple jet impingement electronics enclosures 300a and 300b coupled in parallel and that each contains a respective volume of first coolant 308a or 308b. In this exemplary embodiment, electronics enclosure 308a contains multiple heat-producing electronic components 320, and electronics enclosure 308b contains a single heat producing electronic component 320. It will be understood that an electronic system assembly 204 may alternatively include only a single electronics enclosure 308, or may include three or more separate electronics enclosures 308 that are coupled in parallel, or alternatively coupled in series or coupled in a combination of parallel and series. In one exemplary embodiment, a separate electronics enclosure 308 may be provide to house and cool separate electronic component sub-systems, e.g., such as a power supply, phased array electronics, microcontroller/back end electronics, etc. As shown, each electronic component 202 is coupled to receive power and/or receive, provide and exchange data signals via multiple conductors 350 that are configured for this purpose, and that may be operatively coupled to external power supply and data processing components. While each enclosure 308a and 308b is shown as including air 310 above the volume of coolant 308a or 308b, it will be understood that in other embodiments enclosures 300a and/or 300b may be filled with first coolant and has substantially no air 310 in the respective enclosure 300.

As shown in FIG. 3, a flow of first coolant may enter each enclosure 300 via a flow divider 320, and then either via an inlet manifold 315 or a single inlet 312 (as the case may be) into nozzles 302 that each forms a jet of first coolant 304 that impinges on at least one external surface of a respective electronic device 320. At least the outlet of each nozzle 302 is submerged in the volume of first coolant 308a or 308b, and the jet 304 from each nozzle 302 is fully submerged within the volume of first coolant 308. Once each jet 204 of first coolant impinges on a respective electronic device 320, it is diverted away as shown and intermingles with the volume of coolant 308a or 308b, causing turbulence and carrying away heat from the electronic device 320 before exiting enclosures 300a and 300b via respective fluid exits 314 and a flow combiner 322. Further information on possible configuration and operation of jet impingement enclosures may be found in United States Patent Application Publication Number 2017/0257981, which is incorporated herein by reference in its entirety.

In one embodiment, processing device 220 may be programmed to perform diagnostics and prognostics (D&P) 225 for cooling system 200 in real time when the coolant loops 252 and 254 are both active, e.g., based on measurements of cooling system operational parameters (e.g., operating conditions such as pressures, mass flow rates, and/or temperatures, etc.) at select locations in each of the two coolant loops 252 and 254, or alternatively in only one of these two coolant loops. In one exemplary embodiment, D&P 225 for cooling system 200 may be so performed to verify proper cooling system operation and to detect out-of-specification operational parameters of cooling system 200 based on comparison between expected levels for these measurements in view of the heat load from HPEC 320 to be removed. In a further embodiment, processing device 200 may report cooling system operation that is out-of-specification, e.g., so that the system 200 may be scheduled for a maintenance action. If the cooling system 200 is operating in such way that damage may result to the HPEC 320 being cooled and/or to the coolant loops 252 and 254 themselves, the HPEC 320 and entire cooling system 200 can be shut down if needed, or selectively off-loaded to a lesser level of performance (automatically and/or by a system user in either case). Further, processing device 220 may use D&P 225 to make a system user proactively aware of the current condition of the cooling system operation (e.g., within both coolant loops 252 and 254) as well as whether out-of-specification cooling system operational parameters are being approached and the degree to which they are trending.

Figure 5A:
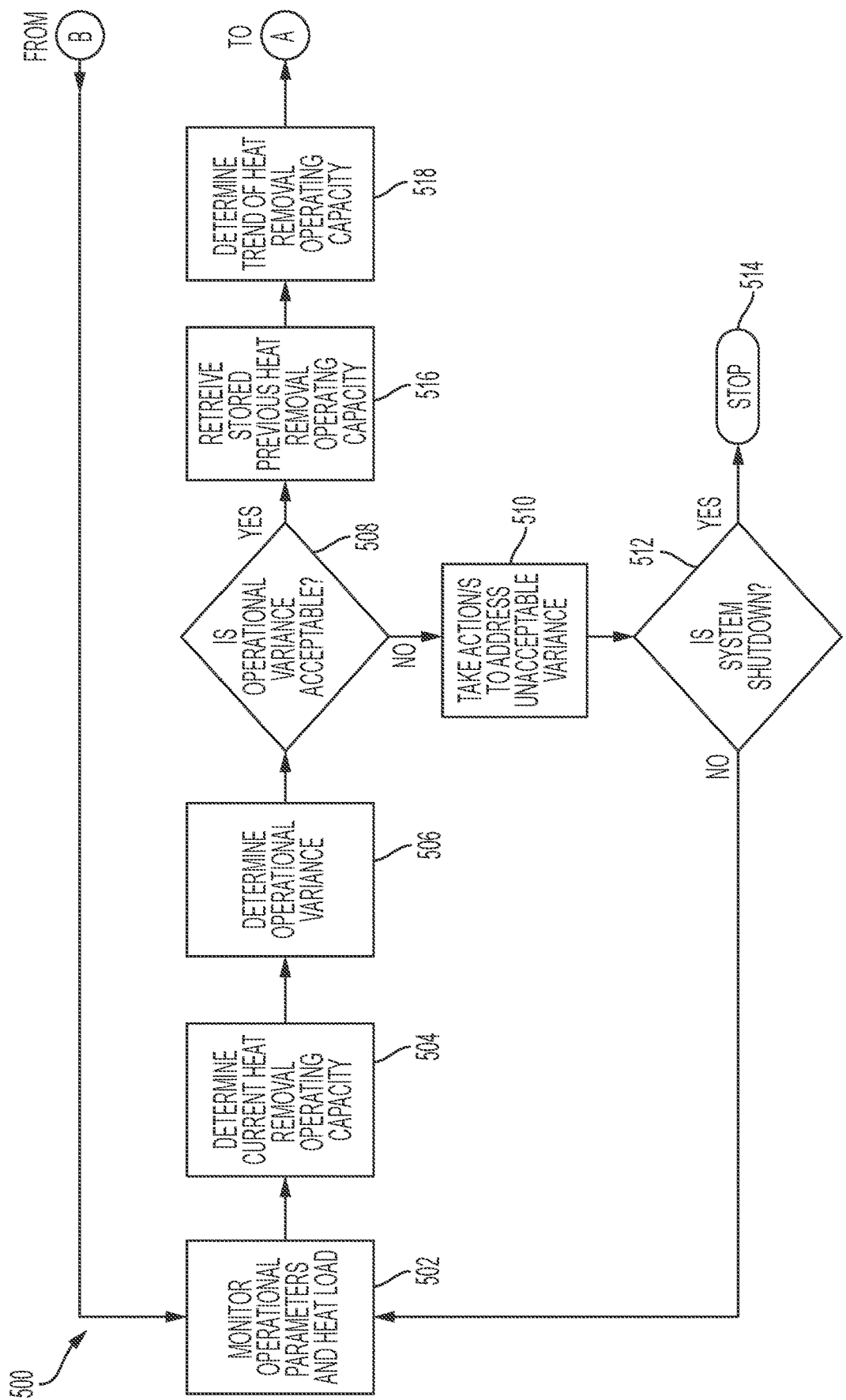
FIG. 5A illustrates methodology according to one exemplary embodiment of the disclosed systems and methods.
Figure 5B:
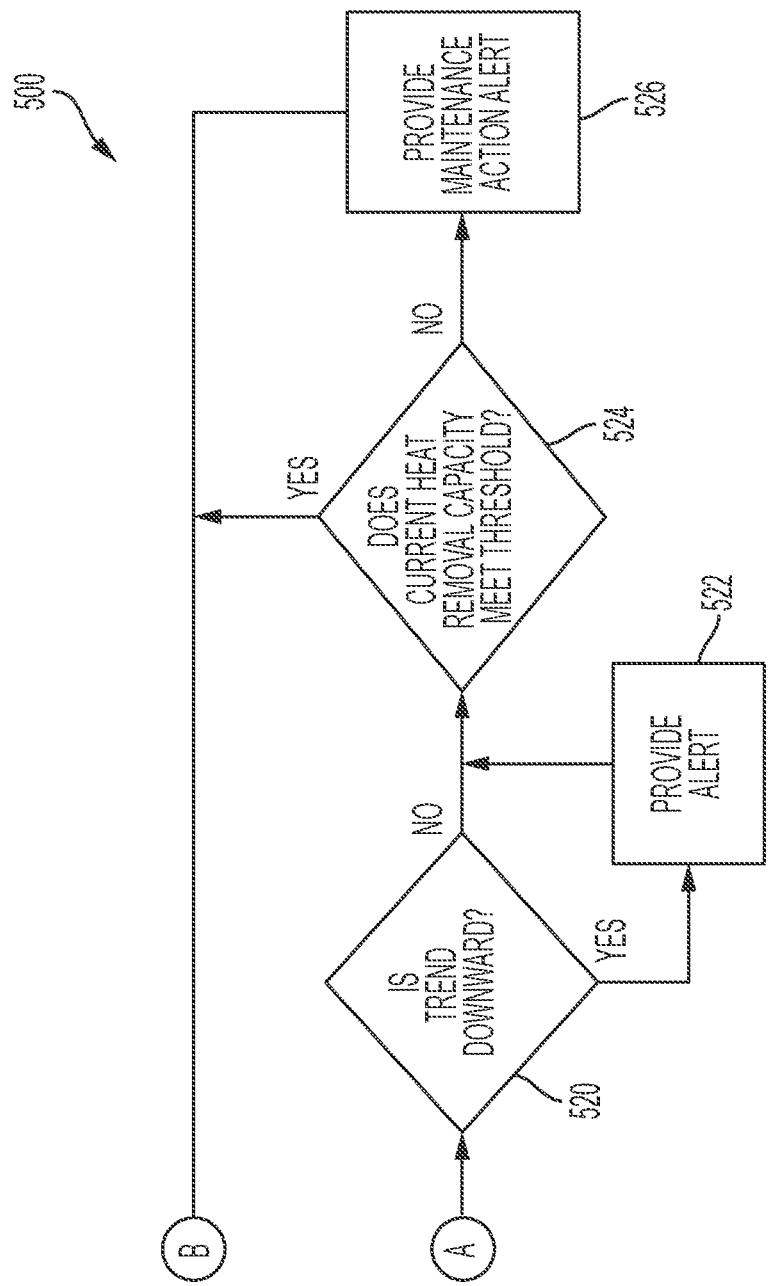
FIG. 5B illustrates methodology according to one exemplary embodiment of the disclosed systems and methods.

For example, FIG. 5 illustrates methodology 500 as it may be implemented and iteratively performed (e.g., by processing device 220) according to one exemplary embodiment of the disclosed systems and methods to perform diagnostics and prognostics (D&P) 225 for an operating multi-coolant loop cooling system 200 such as described and illustrated in relation to FIG. 2. Although described in relation to the cooling system architecture 200 of FIG. 2, it will be understood that methodology 200 may be implemented to perform D&P 225 for other configurations of multi-coolant loop cooling system architecture.

As shown in FIG. 5, real time operational parameters of the cooling system architecture 200 may be monitored by processing device 220 in step 502. Examples of such operational parameters include signals received from various system sensors, e.g., temperature sensors (T1-T5), pressure sensors P1-P5) and mass flow rate sensors (F1-F2). Electronics system 204 may also provide information regarding its current operation mode (and its corresponding heat load or heat generation level) via wired or wireless signal/s 271 to D&P 225 of processing device 220. For example, in a first operation mode, electronics system 204 may produce 20 kW of heat, and in a different second operation mode may produce 35 kW of heat.

In one embodiment, D&P 225 may be programmed to compare measured parameter levels from the sensors in both loops 252 and 254, and compare them to values that are determined to be expected, anticipated, or deemed nominal based on the heat load from the Electronic System 204 and external influences. An example of external influences would be the flow rate F2 and its companion temperatures T4 and T5. Operation of second coolant loop 254 affects the operation the first coolant loop 252. If sensed operational parameter levels from sensors F2, T4 and T5 in the second coolant loop 254 have acceptable values, then it is possible to predict what the sensors in the first coolant loop 252 should read based on the heat load generated within loop 252 and the sensed parameter values from F2, T4, and T5. Any individual sensor reading in the first coolant loop 252 that is not within an acceptable bounds (e.g., within a predefined acceptable operational parameter value range) may itself indicate a malfunction within the first coolant loop 252. Similarly, if the electronic heat load is known (e.g., what heat the first coolant loop 252 is expected to handle from heat-producing components of electronic system assembly 204), then the indicated sensor levels in both loops 252 and 254 may be compared to values determined to be expected, anticipated, or deemed nominal based on the coolant temperatures and mass flow rates in both loops 252 and 254.

Heat load presented to first coolant loop 252 by heat-producing components of electronic system assembly 204 may also be monitored in step 502. The monitored operational parameter information may then be used by processing device 220 to determine real time heat removal operating capacity of first coolant loop 252 in step 504, which may be stored with a date and time stamp in memory 110 and/or storage 108 for future use such as in step 516. Exemplary techniques for determining heat removal operating capacity and heat load are described further herein in Examples 1 and 2 below.

For example, referring to embodiment of FIG. 2, real time heat load may be determined knowing temperatures T1 and T2, and the coolant mass flow rate F1, as well as the specific heat of the first coolant based on the actual operating conditions (e.g., from look up tables and/or curve fitted equations). With this information, the heat load (or heat inputted) into the first coolant stream of first coolant loop 252 by electronic system 204 may be calculated:

Heat load(heat input)=first coolant mass flow rate*first coolant specific heat*(T2−T1)

At the same time, the heat removed from the first coolant stream of first coolant loop 252 and put into the second coolant stream of second coolant loop 254 may be determined in real time knowing temperatures T4 and T5, and the mass flow rate F2:

Heat removed=second coolant mass flow rate*second coolant specific heat*(T5−T4)

In one embodiment, D&P 225 of processing device 220 may perform these calculations and compare the level of heat inputted to the level of heat removed to ensure the first coolant loop 252 is operating properly and not in a run-away situation, e.g., in which temperature of first coolant loop 252 uncontrollably increases above a maximum allowable operating temperature. This comparison may take into account heat load transients and the transport time of the first coolant from the Electronics System 204 to heat exchanger 214.

Next, a current operational variance is determined in step 506 from the difference between real time heat removal of step 504 and real time heat load of step 502, i.e., (current operational variance)=(real time heat removal)−(real time heat load). Then, it is determined in step 508 whether this determined operational variance is acceptable, i.e., is the operational variance greater than zero? If the operational variance is not greater than zero, then the operational variance is not acceptable because the determined real time heat load presented by electronic components of electronic system assembly 204 is greater than or equal to the determined real time heat removal capacity of cooling system 200. In such a case, one or more actions may then be taken in step 510 to address this unacceptable variance condition. One example of an automatic action that may be in step 510 is automatically shutting down the operating multi-coolant loop cooling system 200 using wired or wireless command signal/s 270 transmitted from processing device 220 to shut down heat-producing electronic system components of the electronic system assembly 204, and to optionally to shut down the operating components of first coolant loop 252 (such as pump 210 and heat source 206) and second coolant loop 254 (such as remote cooling system 216). Another example of an automatic action that may be taken in step 510 is automatically reducing heat load presented by heat-producing electronic system components of the electronic system assembly 204 by command signal/s from processing device 220, e.g., to reduce radio transmission power, reduce electronic component duty cycle, etc.

Besides the above automatic actions taken by processing device 220 in step 510, it is additionally or alternatively possible that an alert may be displayed in step 510 on display device 104 via host processing device 102 (or otherwise communicated such as by audio alert via a speaker) to a human user of the operating multi-coolant loop cooling system 200, e.g., a message instructing the user to shut down multi-coolant loop cooling system 200 or to reduce heat-producing capacity of the electronic components of electronic system 204. The system user may then take the indicated action according to the displayed instructions, e.g., via control commands entered via I/O 106 and data communication bus 274. Following step 510, methodology 500 may then iteratively repeat from step 512 to step 502 in the case that the multi-coolant loop cooling system 200 continues operating (e.g., with reduced heat load). However, if the multi-coolant loop cooling system 200 is instead shutdown in step 510, then methodology 500 responds in step 512 by terminating at step 514 until next power on of multi-coolant loop cooling system 200.

In the case that the operational variance is determined to greater than zero in step 508 of FIG. 5, then this means that the operational variance is acceptable because the determined current real time operating heat removal capacity of cooling system 200 is greater than the determined current real time heat load presented by electronic components of electronic system assembly 204. In such a case, all components of cooling system architecture 200 continue to operate and methodology 500 proceeds steps 516 and 518, where a current trend of operating heat removal capacity of cooling system 200 is determined by comparing the current real time operating heat removal capacity of cooling system 200 to previously-determined operating heat removal capacity values of system 200.

In one embodiment, processing device 220 may perform step 516 by first retrieving one or more previously determined operating heat removal capacity values that have been stored with date and time stamps in memory 110 and/or storage 108, e.g., during step 504. The current real time operating heat removal capacity of the cooling system 200 may then be compared in step 518 to the retrieved previous operating heat removal capacity value/s of system 200 to determine any upward or downward trend in value of operating heat removal capacity value/s versus time. The results of the comparison in step 518 may then be optionally displayed or otherwise indicated to the user on display device 104 via host processing device 102 or other suitable manner, e.g., as a simple indication of upward or downward trend compared to the most recent retrieved previous operating heat removal capacity value/s, as a table or graph of multiple previous operating heat removal capacity value/s and the current real time operating heat removal capacity value as a function of time, etc. It is also possible that real time and/or historical monitored operational parameters and/or heat load of step 502 may be optionally displayed to a user on display device 104.

In one exemplary embodiment, an optional alert may be displayed or otherwise provided (e.g., via host processing device 102 on display device 104) in step 522 to the user when it is determined in step 520 that a downward trend in value of operating heat removal capacity value/s versus time is determined. Such an alert may advise the user that a system maintenance action may be required, e.g., such as the position of bypass valve 212 may not be in its normal operating position for the same operating conditions as experienced before. In such an example, improper positioning of bypass valve 212 may be caused by malfunction of the bypass valve 212, a clogged heat exchanger 214, a problem with pump 210, or other issues. This information together with other variances may result in user maintenance actions that include, for example, assessing the bypass valve 212 for proper operating, checking the pump, and checking the heat exchanger as well as other items. In one embodiment, an alert of step 520 may not only inform a user of the nature of the maintenance action problem (e.g., improper bypass valve position), but also may inform the user of the above enumerated actions that are recommended to address the problem.

Next, in step 524, it is determined whether the value of the current real time operating heat removal capacity of cooling system 200 meets a predefined minimum heat removal capacity threshold. If not, then an alert is generated and displayed or otherwise indicated in step 526 to the system user that a maintenance action is required (e.g., such as described above in relation to step 520), and methodology 200 returns to step 502 and repeats. At this time, the user may respond to the alert, e.g., by performing one or more maintenance items (as previously listed) and shutting down the cooling system 200 via control command/s entered by I/O 106 via data communication bus 274 if needed. However, if the value of the current real time operating heat removal capacity of cooling system 200 is found to meet the predefined minimum heat removal capacity threshold in step 224, then methodology 200 repeats to step 502 and repeats with no further alert or alert generated.

It will be understood that methodology of FIG. 5 is exemplary only, and that any combination of fewer, additional and/or alternative steps may be employed that are suitable for implementing and managing an intelligent heat transfer interface between multiple different coolant loops of a cooling system that is configured to cool heat-producing electronic component/s.

The following hypothetical examples for a multi-coolant loop cooing system are discussed in relation to methodology 500, and are illustrative only.

Example 1

Assume a measured current heat load of 19 kilowatts (kW) is measured in step 502, and a current real-time heat removal operating capacity of 21.5 kW is determined in step 504 based on operational parameters measured from sensors T1, T3 and F1 in step 502. In such a case, the current operational variance is determined in step 506 to be 21.5 kW 19 kW=2.5 kW. This determined operation variance is found acceptable in step 508 because it is greater than zero, which means that the multi-coolant loop cooling system is operating with acceptable performance and thus methodology proceeds to step 516 where a previously-stored cooling system heat removal operating capacity value of 22.0 kW is retrieved from system non-volatile storage 108. The current heat removal operating capacity of 21.5 kW is then compared in step 518 to the previous heat removal operating capacity of 22.0 kW to determine that cooling system heat removal operating capacity is trending downward (e.g., 21.5 kW 22.0 kW=−0.5 kW). Therefore, an alert is generated and displayed in step 522 on display device 104 to indicate to a user that the heat removal operating capacity is trending downward and that possible maintenance action may be required in the future due to apparent capacity downward trend (22.0 kW prior vs. 21.5 kW current). Next, the current heat removal operating capacity is compared in step 524 to a predefined heat removal operating capacity threshold value of 20 kW (e.g., stored in non-volatile storage 108) to determine that the current heat removal operating capacity of 21.5 kW meets or exceeds the predefined minimum threshold value of 20 kW. Since the predefined heat removal operating capacity threshold value is met or exceeded, methodology 500 returns to step 502 and iteratively repeats with no further user alerts.

Example 2

Assume a measured current heat load of 19 kilowatts (kW) is measured in step 502, and a current real-time heat removal operating capacity of 19.5 kW is determined in step 504 based on operational parameters measured from sensors T1, T3 and F1 in step 502. In such a case, the current operational variance is determined in step 506 to be 19.5 kW 19.0 kW=0.5 kW. This determined operation variance is found acceptable in step 508 because it is greater than zero, which means that the multi-coolant loop cooling system is operating with acceptable performance and thus methodology proceeds to step 516 where a previously-stored cooling system heat removal operating capacity value of 21.5 kW is retrieved from system non-volatile storage 108. The current heat removal operating capacity of 19.5 kW is then compared in step 518 to the previous heat removal operating capacity of 21.5 kW to determine that cooling system heat removal operating capacity is trending downward (e.g., 19.5 kW 21.5 kW=−1.0 kW). Therefore, an alert is generated and displayed in step 522 on display device 104 to indicate to a user that the heat removal operating capacity is trending downward and that possible maintenance action may be required in the future due to apparent capacity downward trend (21.5 kW prior vs. 19.5 kW current). Next, the current heat removal operating capacity is compared in step 524 to a predefined heat removal operating capacity threshold value of 20 kW (e.g., stored in non-volatile storage 108) to determine that the current heat removal operating capacity of 19.5 kW does not meet the predefined minimum threshold value of 20 kW. Since the predefined heat removal operating capacity threshold value is not met, methodology 500 returns to step 526 and generates and displays a required maintenance action alert on display device 104 instructing the user to perform maintenance actions (previously described) and/or to shut down components of the cooling system 200.

It will be understood that one or more of the tasks, functions, or methodologies described herein (e.g., including those described herein for components 102, 220, 320, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions is configured when executed on a processing device in the form of a programmable integrated circuit (e.g., processor such as CPU, microcontroller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, microcontroller, microcontroller, microprocessor, FPGA, CPLD and ASIC. The computer program of instructions may include an ordered listing of executable instructions for implementing logical functions in a computer system or component thereof. The executable instructions may include a plurality of code segments operable to instruct components system components to perform the methodologies disclosed herein.

It will also be understood that one or more steps of the present methodologies may be employed in one or more code segments of the computer program. For example, a code segment executed by a processing device may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus, the invention is not limited to only those combinations shown herein, but rather may include other combinations.

What is claimed is:

1. A method, comprising:
    circulating a first coolant through a first coolant loop while circulating a different second coolant through a separate second coolant loop, the first coolant loop being in thermal contact with the second coolant loop across a thermal interface;
    operating one or more electronic system components in a turned on condition to produce a heat load that inputs heat to the circulating first coolant of the first coolant loop;
    removing the heat from the circulating first coolant of the first coolant loop to the circulating second coolant of the second coolant loop across the thermal interface, the heat removed from the circulating first coolant being the heat input by the one or more electronic system components to the first coolant;
    sensing multiple different operational parameters of the first coolant loop to determine at least one of a magnitude of the heat input by the electronic system components to the circulating first coolant or a magnitude of the heat removed by the thermal interface from the circulating first coolant to the circulating second coolant, the multiple different operational parameters comprising:
        one or more temperatures of the circulating first coolant,
        a mass flow rate of the circulating first coolant, and
        a pressure of the circulating first coolant;
    taking one or more control and/or user alert actions based on at least one of the determined magnitude of the heat input by the one or more electronic system components to the circulating first coolant or the determined magnitude of the heat removed by the thermal interface from the circulating first coolant, and
    setting the mass flow rate of the first coolant within the first coolant loop to maintain the pressure within the first coolant loop to not exceed a predefined maximum allowable pressure of the circulating first coolant.

2. The method of claim 1, wherein the heat is input by the heat load of the electronic system component to the circulating first coolant at a first location within the first coolant loop;
    wherein the heat is removed by the thermal interface from the first coolant at a different second location within the first coolant loop;
    wherein the circulating the first coolant through the first coolant loop comprises circulating the first coolant in a single direction through the first coolant loop between the first location and the second location;
    wherein the one or more temperatures of the circulating first coolant comprise a first temperature of the circulating first coolant and a second temperature of the first coolant; and
    wherein the sensing the multiple different operational parameters of the first coolant loop comprises monitoring the multiple different operational parameters of the first coolant loop to determine the magnitude of the heat input by the electronic system components to the circulating first coolant by:
        sensing the first temperature of the circulating first coolant after it leaves the second location and before it arrives at the first location,
        sensing the second temperature of the circulating first coolant after it leaves the first location and before it arrives at the second location, and
        sensing the mass flow rate of the circulating first coolant.

3. The method of claim 1, further comprising:
    monitoring the multiple different operational parameters of the first coolant loop to determine the magnitude of the heat input by the electronic system components to the circulating first coolant, and to determine the magnitude of the heat removed by the thermal interface from the circulating first coolant to the circulating second coolant;
comparing the determined magnitude of the heat input to the circulating first coolant to the determined magnitude of the heat removed from the circulating first coolant; and
taking the one or more control and/or user alert actions based on the comparison of the determined magnitude of the heat input to the circulating first coolant to the determined magnitude of the heat removed from the circulating first coolant.

4. The method of claim 1, wherein the thermal interface comprises a heat exchanger;
wherein the first coolant comprises a liquid coolant having a viscosity of less than or equal to 21 centistokes at a temperature of −60° C.; and
wherein the second coolant comprises a liquid coolant having a viscosity of greater than or equal to 1130 centistokes at a temperature of −60° C.

5. The method of claim 1, wherein the taking the one or more control and/or user alert actions comprises communicating an alert message to a user.

6. The method of claim 1, wherein the taking the one or more control and/or user alert actions comprises taking the one or more control actions.

7. A system, comprising:
a first coolant loop including a first pump circulating a first coolant and a separate second coolant loop including a second pump circulating a different second coolant, the first coolant loop being coupled in thermal contact with the second coolant loop across a thermal interface;
one or more electronic system components operating to produce a heat load that inputs heat to the circulating first coolant of the first coolant loop that is removed from the circulating first coolant of the first coolant loop to the circulating second coolant of the second coolant loop across the thermal interface, the heat removed from the circulating first coolant being the heat input by the one or more electronic system components to the first coolant;
multiple different sensors sensing multiple different operational parameters of the first coolant loop, the multiple different operational parameters comprising:
one or more temperatures of the circulating first coolant,
a mass flow rate of the circulating first coolant, and
a pressure of the circulating first coolant;
a programmable integrated circuit receiving signals representative of the sensed multiple different operational parameters from the multiple different sensors, the programmable integrated circuit being programmed to:
use the sensed multiple different operational parameters to determine at least one of a magnitude of the heat input by the electronic system components to the circulating first coolant or a magnitude of the heat removed by the thermal interface from the circulating first coolant to the circulating second coolant, and
take one or more control and/or user alert actions based on at least one of the determined magnitude of the heat input by the one or more electronic system components to the circulating first coolant or the determined magnitude of heat removed by the thermal interface from the circulating first coolant, and
set the mass flow rate of the first coolant within the first coolant loop to maintain the pressure within the first coolant loop to not exceed a predefined maximum allowable pressure of the circulating first coolant.

8. The system of claim 7, wherein the multiple different sensors comprise a first temperature sensor sensing a first temperature of the circulating first coolant, a second temperature sensor sensing a second temperature of the circulating first coolant, and a mass flow rate sensor sensing a mass flow rate of the circulating first coolant;
wherein the electronic system components are thermally coupled to input the heat to the circulating first coolant at a first location within the first coolant loop;
wherein the thermal interface is thermally coupled to remove the heat from the first coolant at a different second location within the first coolant loop;
wherein the first pump circulates the first coolant through the first coolant loop in a single direction the first location and the second location; and
wherein the programmable integrated circuit is programmed to monitor the multiple different operational parameters of the first coolant loop to determine the magnitude of the heat input by the electronic system components to the circulating first coolant from:
the sensed first temperature received from the first temperature sensor of the circulating first coolant after it leaves the second location and before it arrives at the first location,
the sensed second temperature received from the second temperature sensor of the circulating first coolant after it leaves the first location and before it arrives at the second location, and
the sensed mass flow rate of the circulating first coolant received from the mass flow rate sensor.

9. The system of claim 7, wherein the programmable integrated circuit is programmed to:
monitor the multiple different operational parameters of the first coolant loop to determine the magnitude of the heat input by the electronic system components to the circulating first coolant, and to determine the magnitude of the heat removed by the thermal interface from the circulating first coolant to the circulating second coolant;
compare the determined magnitude of the heat input to the circulating first coolant to the determined magnitude of the heat removed from the circulating first coolant; and
take the one or more control and/or user alert actions based on the comparison of the determined heat of the heat input to the circulating first coolant to the determined magnitude of the heat removed from the circulating first coolant.

10. The system of claim 7, wherein the thermal interface comprises a heat exchanger;
where in the first coolant comprises a liquid coolant having a viscosity of less than or equal to 21 centistokes at a temperature of −60° C.; and
wherein the second coolant comprises a liquid coolant having a viscosity of greater than or equal to 1130 centistokes at a temperature of −60° C.

11. The system of claim 7, wherein the take the one or more control and/or user alert actions comprises communicating an alert message to a user.

12. The system of claim 7, wherein the take the one or more control and/or user alert actions comprises taking one or more control actions.

13. A method, comprising:
circulating a first coolant through a first coolant loop while circulating a different second coolant through a separate second coolant loop, the first coolant loop being in thermal contact with the second coolant loop across a thermal interface;

operating one or more electronic system components in a turned on condition to produce a heat load that inputs heat to the circulating first coolant of the first coolant loop;

removing the heat from the circulating first coolant of the first coolant loop to the circulating second coolant of the second coolant loop across the thermal interface, the heat removed from the circulating first coolant being the heat input by the one or more electronic system components to the first coolant;

sensing one or more operational parameters of the first coolant loop to determine a current magnitude of the heat removed by the thermal interface from the circulating first coolant to the circulating second coolant, comparing the determined current magnitude of the heat removed by the thermal interface from the circulating first coolant to the circulating second coolant to a previously determined magnitude of the heat removed by the thermal interface from the circulating first coolant to the circulating second coolant to determine a trend over time in direction of the magnitude of the heat removed by the thermal interface from the circulating first coolant to the circulating second coolant, and taking one or more user alert actions in response to a determined downward trend over time in direction of the magnitude of the heat removed by the thermal interface from the circulating first coolant to the circulating second coolant by communicating an alert to instruct a user to take one or more maintenance actions to stop or reverse the determined downward trend over time in direction of the magnitude of the heat removed by the thermal interface from the circulating first coolant to the circulating second coolant.

14. A method, comprising:

circulating a first coolant through a first coolant loop while circulating a different second coolant through a separate second coolant loop, the first coolant loop being in thermal contact with the second coolant loop across a thermal interface;

operating one or more electronic system components in a turned on condition to produce a heat load that inputs heat to the circulating first coolant of the first coolant loop; removing the heat from the circulating first coolant of the first coolant loop to the circulating second coolant of the second coolant loop across the thermal interface, the heat removed from the circulating first coolant being the heat input by the one or more electronic system components to the first coolant;

sensing one or more operational parameters of the first coolant loop;

monitoring the one or more operational parameters of the first coolant loop to determine a current magnitude of the heat removed by the thermal interface from the circulating first coolant to the circulating second coolant, comparing the determined current magnitude of the heat removed by the thermal interface from the circulating first coolant to the circulating second coolant to a predefined minimum heat removal capacity threshold value, and taking one or more user alert actions in response to a determination that the determined current magnitude of the heat removed by the thermal interface from the circulating first coolant to the circulating second coolant is less than the predefined minimum heat removal capacity threshold value by communicating an alert instructing a user to take one or more maintenance actions to increase the magnitude of the heat removed by the thermal interface from the circulating first coolant to the circulating second coolant.

15. A method, comprising:

circulating a first coolant through a first coolant loop while circulating a different second coolant through a separate second coolant loop, the first coolant loop being in thermal contact with the second coolant loop across a thermal interface;

operating one or more electronic system components in a turned on condition to produce a heat load that inputs heat to the circulating first coolant of the first coolant loop;

removing the heat from the circulating first coolant of the first coolant loop to the circulating second coolant of the second coolant loop across the thermal interface, the heat removed from the circulating first coolant being the heat input by the one or more electronic system components to the first coolant;

sensing one or more operational parameters of the first coolant loop;

monitoring the one or more operational parameters of the first coolant loop to determine the magnitude of the heat input by the electronic system components to the circulating first coolant, and to determine the magnitude of the heat removed by the thermal interface from the circulating first coolant to the circulating second coolant, comparing the determined magnitude of the heat input to the circulating first coolant to the determined magnitude of the heat removed from the circulating first coolant;

and taking one or more control actions based on results of the comparison of the determined magnitude of the heat input to the circulating first coolant to the determined magnitude of the heat removed from the circulating first coolant by:

controlling the electronic system components to reduce an amount of the heat input to the circulating first coolant of the first coolant loop by the electronic system components in response to a determination that the results of the comparison of the determined magnitude of the heat input to the circulating first coolant to the determined magnitude of the heat removed is greater than the determined heat removal magnitude.

16. A system, comprising:

a first coolant loop including a first pump circulating a first coolant and a separate second coolant loop including a second pump circulating a different second coolant, the first coolant loop being coupled in thermal contact with the second coolant loop across a thermal interface;

one or more electronic system components operating to produce a heat load that inputs heat to the circulating first coolant of the first coolant loop that is removed from the circulating first coolant of the first coolant loop to the circulating second coolant of the second coolant loop across the thermal interface, the heat removed from the circulating first coolant being the heat input by the one or more electronic system components to the first coolant;

one or more sensors sensing one or more operational parameters of the first coolant loop;

a programmable integrated circuit is controlling the electronic system components, and receiving signals representative of the sensed one or more operational parameters from the one or more sensors, the programmable integrated circuit being programmed to:
monitor the sensed one or more operational parameters of the first coolant loop to determine the magnitude of the heat input by the electronic system components to the circulating first coolant, and to determine the magnitude of the heat removed by the thermal interface from the circulating first coolant to the circulating second coolant,
compare the determined magnitude of the heat input to the circulating first coolant to the determined magnitude of the heat removed from the circulating first coolant, and
take the one or more control actions based on results of the comparison of the determined magnitude of the heat input by the one or more electronic system components to the determined magnitude of the heat removed by:
controlling the electronic system components to reduce an amount of the heat input to the circulating first coolant of the first coolant loop by the electronic system components in response to a determination that the results of the comparison of the determined magnitude of the heat input to the determined magnitude of the heat removed indicates that the determined magnitude of the heat input is greater than the determined magnitude of the heat removed.

17. A method, comprising:
circulating a first coolant through a first coolant loop while circulating a different second coolant through a separate second coolant loop, the first coolant loop being in thermal contact with the second coolant loop across a thermal interface;
operating one or more electronic system components in a turned on condition to produce a heat load that inputs heat to the circulating first coolant of the first coolant loop;
removing the heat from the circulating first coolant of the first coolant loop to the circulating second coolant of the second coolant loop across the thermal interface, the heat removed from the circulating first coolant being the heat input by the one or more electronic system components to the first coolant;
sensing one or more operational parameters of the first coolant loop;
monitoring the one or more operational parameters of the first coolant loop to determine the magnitude of the heat input by the electronic system components to the circulating first coolant, and to determine the magnitude of the heat removed by the thermal interface from the circulating first coolant to the circulating second coolant,
comparing the determined magnitude of the heat input to the circulating first coolant to the determined magnitude of the heat removed from the circulating first coolant, and
taking one or more user alert actions based on results of the comparison of the determined magnitude of the heat input to the circulating first coolant to the determined magnitude of the heat removed by:
communicating an alert instructing a user to control the electronic system components to reduce an amount of the heat input to the circulating first coolant of the first coolant loop by the electronic system components in response to a determination that the results of the comparison of the determined magnitude of the heat input to the circulating first coolant to the determined magnitude of the heat removed indicates that the determined heat input magnitude is greater than the determined heat removal magnitude.

18. A system, comprising:
a first coolant loop including a first pump circulating a first coolant and a separate second coolant loop including a second pump circulating a different second coolant, the first coolant loop being coupled in thermal contact with the second coolant loop across a thermal interface;
one or more electronic system components operating to produce a heat load that inputs heat to the circulating first coolant of the first coolant loop that is removed from the circulating first coolant of the first coolant loop to the circulating second coolant of the second coolant loop across the thermal interface, the heat removed from the circulating first coolant being the heat input by the one or more electronic system components to the first coolant;
one or more sensors sensing one or more operational parameters of the first coolant loop;
a programmable integrated circuit receiving signals representative of the sensed one or more operational parameters from the one or more sensors, the programmable integrated circuit being programmed to:
monitor the sensed one or more operational parameters of the first coolant loop to determine the magnitude of the heat input by the electronic system components to the circulating first coolant, and to determine the magnitude of the heat removed by the thermal interface from the circulating first coolant to the circulating second coolant,
compare the determined magnitude of the heat input to the circulating first coolant to the determined magnitude of the heat removed from the circulating first coolant;
and
take one or more user alert actions based on results of the comparison of the determined magnitude of the heat input to the determined magnitude of the heat removed from the circulating first coolant by:
communicating an alert instructing a user to control the electronic system components to reduce an amount of the heat input to the circulating first coolant of the first coolant loop by the electronic system components in response to a determination that the results of the comparison of the determined magnitude of the heat input to the determined magnitude of the heat removed indicates that the determined magnitude of the heat input is greater than the determined magnitude of the heat removed.

19. A method, comprising:
circulating a first coolant through a first coolant loop while circulating a different second coolant through a separate second coolant loop, the first coolant loop being in thermal contact with the second coolant loop across a thermal interface;
operating one or more electronic system components in a turned on condition to produce a heat load that inputs heat to the circulating first coolant of the first coolant loop;

removing the heat from the circulating first coolant of the first coolant loop to the circulating second coolant of the second coolant loop across the thermal interface, the heat removed from the circulating first coolant being the heat input by the one or more electronic system components to the first coolant;

sensing one or more first operational parameters of the first coolant loop, the one or more first operational parameters comprising a current temperature, a current pressure and a current mass flow rate of the first coolant within the first coolant loop; and iteratively performing a sequence of steps as follows to warm the first coolant up to a first operating temperature setpoint whenever the current temperature of the first coolant is below the first operating temperature setpoint:
  a) circulating the first coolant at a maximum mass flow rate that does not result in a current first coolant pressure that exceeds a maximum working pressure of any components of the first coolant loop that are exposed to the circulating first coolant while sensing the current temperature, the current pressure and the current mass flow rate of the circulating first coolant within the first coolant loop,
  b) then determining a level of additional heat to input from a heat source different from the one or more electronic system components to the circulating first coolant that is based at least in part on the sensed current mass flow rate and the sensed current temperature of the circulating first coolant,
  c) then controlling the heat source to produce and input the determined level of additional heat into the circulating first coolant,
  d) then iteratively repeating a) to c) until the current temperature of the first coolant is at or above the first operating temperature setpoint, and
  e) then controlling the heat source to produce none of the additional heat whenever the current temperature of the first coolant is at or above the first operating temperature setpoint.

20. The method of claim 19, further comprising determining a current viscosity of the circulating first coolant based on the current temperature of the circulating first coolant using a predetermined relationship of viscosity as a function of the current temperature for the circulating first coolant; and determining the level of the additional heat to input to the circulating first coolant based on the current viscosity using a predetermined relationship of heat transfer capability as a function of the current temperature and the current mass flow rate of the first coolant.

21. The method of claim 19, further comprising turning off the electronic system components for at least a portion of a time that the heat source is controlled to produce and input the determined level of additional heat into the circulating first coolant.

22. The method of claim 19, further comprising controlling a flow of the first coolant to bypass the thermal interface so that none of the additional heat is removed from the circulating first coolant of the first coolant loop to the circulating second coolant of the second coolant loop across the thermal interface for at least a portion of a time the heat source is controlled to produce and input the determined level of heat into the circulating first coolant.

23. The method of claim 19, further comprising warming the second coolant up to a second operating temperature setpoint when a current temperature of the second coolant is below the second operating temperature setpoint by removing at least the additional heat from the circulating first coolant of the first coolant loop to the second coolant of the second coolant loop across the thermal interface for at least a portion of a time the heat source is controlled to produce and input the additional heat into the circulating first coolant.

24. The method of claim 23, further comprising turning off the electronic system components for at least a portion of a time that the heat is removed from the circulating first coolant of the first coolant loop to the second coolant of the second coolant loop across the thermal interface to warm the second coolant up to the second operating temperature setpoint.

25. The method of claim 19, wherein the thermal interface comprises a heat exchanger;
  wherein the first coolant comprises a liquid coolant having a viscosity of less than or equal to 21 centistokes at a temperature of −60° C.; and
  wherein the second coolant comprises a liquid coolant having a viscosity of greater than or equal to 1130 centistokes at a temperature of −60° C.

26. The method of claim 19, further comprising sensing one or more second operational parameters of the second coolant loop, the one or more second operational parameters of the second coolant loop comprising a current temperature of the second coolant within the second coolant loop; and performing the following prior to performing the sequence of a) to e):
  comparing the current temperature of the second coolant within the second coolant loop to the current temperature of the first coolant within the first coolant loop; and
  activating a first pump of the first coolant loop while controlling a second pump of the second coolant loop to circulate the second coolant within the second coolant loop to transfer second coolant loop heat across the thermal interface from the second coolant circulating in the second coolant loop to the first coolant in the first coolant loop if it is determined that the current temperature of the second coolant within the second coolant loop is greater than the current temperature of the first coolant within the first coolant loop.

27. A system, comprising:
  a first coolant loop including a first pump circulating a first coolant and a separate second coolant loop including a second pump circulating a different second coolant, the first coolant loop being coupled in thermal contact with the second coolant loop across a thermal interface;
  one or more electronic system components operating to produce a heat load that inputs heat to the circulating first coolant of the first coolant loop that is removed from the circulating first coolant of the first coolant loop to the circulating second coolant of the second coolant loop across the thermal interface;
  a heat source thermally coupled to input additional heat to the circulating first coolant of the first coolant loop, the heat source being different from the one or more electronic system components;
  one or more first sensors sensing one or more first operational parameters of the first coolant loop, the one or more first operational parameters comprising a current temperature, a current pressure and a current mass flow rate of the first coolant within the first coolant loop;
  a programmable integrated circuit controlling the heat source and the first pump and receiving signals representative of the sensed one or more first operational parameters from the one or more first sensors, the programmable integrated circuit being programmed to iteratively perform the following sequence of steps to warm the first coolant up to a first operating temperature setpoint whenever a sensed current temperature of the first coolant is below the first operating temperature setpoint:
- a) controlling the first pump to circulate the first coolant at a maximum mass flow rate that does not result in the sensed current pressure of the first coolant exceeding a maximum working pressure of any components of the first coolant loop that are exposed to the circulating first coolant,
- b) then determining a level of the additional heat to input to the circulating first coolant that is based at least in part on the sensed current mass flow rate and the sensed current temperature of the circulating first coolant,
- c) then controlling the heat source to produce and input the determined level of the additional heat into the circulating first coolant,
- d) then iteratively repeating a) to c) until the current temperature of the first coolant is at or above the first operating temperature setpoint, and
- e) then controlling the heat source to produce none of the additional heat whenever the current temperature of the first coolant is at or above the first operating temperature setpoint.

28. The system of claim 27, further comprising non-volatile memory coupled to the programmable integrated circuit, the non-volatile memory storing a predetermined relationship of viscosity as a function of the current temperature for the first coolant and a predetermined relationship of heat transfer capability as a function of the current temperature and the current mass flow rate of the first coolant; and
wherein the programmable integrated circuit is programmed to access the predetermined relationship of viscosity as a function of the current temperature for the first coolant to determine a current viscosity of the circulating first coolant at the current temperature of the circulating first coolant, and to access the predetermined relationship of heat transfer capability as a function of the current temperature and the current mass flow rate of the first coolant to determine the level of the additional heat to input to the circulating first coolant at the determined current viscosity of the circulating first coolant.

29. The system of claim 27, wherein the programmable integrated circuit is controlling the electronic system components, the programmable integrated circuit being further programmed to turn off the electronic system components for at least a portion of the a time that the heat source is controlled to produce and input the determined level of the additional heat into the circulating first coolant.

30. The system of claim 27, further comprising a bypass valve selectively routing a flow of the circulating first coolant either through or around the thermal interface, the programmable integrated circuit controlling the bypass valve and being programmed to control the bypass valve to route the flow of the first coolant around the thermal interface so that none of the additional heat is removed from the circulating first coolant of the first coolant loop to the circulating second coolant of the second coolant loop across the thermal interface for at least a portion of a time the heat source is controlled to produce and input the determined level of the additional heat into the circulating first coolant.

31. The system of claim 27, further comprising one or more second sensors sensing a current temperature of the second coolant within the second coolant loop; and
wherein the programmable integrated circuit is further programmed to control the heat source and the first pump to circulate the first coolant to warm the second coolant up to a second operating temperature setpoint when the current temperature of the second coolant is below the second operating temperature setpoint by transferring at least the additional heat from the circulating first coolant of the first coolant loop to the second coolant of the second coolant loop across the thermal interface for at least a portion of a time the heat source is controlled to produce and input the additional heat into the circulating first coolant.

32. The system of claim 31, wherein the programmable integrated circuit is further programmed to turn off the electronic system components for at least a portion of a time that the heat is removed from the circulating first coolant of the first coolant loop to the second coolant of the second coolant loop across the thermal interface to warm the second coolant up to the second operating temperature setpoint.

33. The system of claim 27, wherein the thermal interface comprises a heat exchanger;
wherein the first coolant comprises a liquid coolant having a viscosity of less than or equal to 21 centistokes at a temperature of −60° C.; and
wherein the second coolant comprises a liquid coolant having a viscosity of greater than or equal to 1130 centistokes at a temperature of −60° C.

34. The system of claim 27, further comprising one or more second sensors sensing one or more second operational parameters of the second coolant loop, the one or more second operational parameters of the second coolant loop comprising a current temperature of the second coolant within the second coolant loop; and the programmable integrated circuit being programmed to perform the following prior to performing the sequence of a) to e):
receive signals from the one or more first sensors that are representative of the current temperature of the first coolant within the first coolant loop;
receive signals from the one or more second sensors that are representative of the current temperature of the second coolant within the second coolant loop;
compare the current temperature of the second coolant within the second coolant loop to the current temperature of the first coolant within the first coolant loop; and
activate the first pump while controlling the second pump to circulate the second coolant within the second coolant loop to transfer heat across the thermal interface from the second coolant circulating in the second coolant loop to the first coolant in the first coolant loop if it is determined that the current temperature of the second coolant is within the second coolant loop is greater than the current temperature of the first coolant within the first coolant loop.

* * * * *